(12) United States Patent
Kajiwara et al.

(10) Patent No.: US 8,183,607 B2
(45) Date of Patent: May 22, 2012

(54) SEMICONDUCTOR DEVICE

(75) Inventors: Ryoichi Kajiwara, Hitachi (JP);
Masahiro Koizumi, Hitachi (JP);
Toshiaki Morita, Hitachi (JP); Kazuya Takahashi, Hitachinaka (JP); Munehisa Kishimoto, Kamakura (JP); Shigeru Ishii, Tomiya-machi (JP); Toshinori Hirashima, Takasaki (JP); Yasushi Takahashi, Nishiyokote-machi (JP); Toshiyuki Hata, Maebashi (JP); Hiroshi Sato, Takasaki (JP); Keiichi Ookawa, Takasaki (JP)

(73) Assignees: Renesas Electronics Corporation, Kanagawa (JP); Hitachi Tohbu Semiconductor, Ltd., Gunma (JP)

( * ) Notice: Subject to any disclaimer, the term of this patent is extended or adjusted under 35 U.S.C. 154(b) by 0 days.

(21) Appl. No.: 13/189,883

(22) Filed: Jul. 25, 2011

(65) Prior Publication Data

US 2011/0298020 A1    Dec. 8, 2011

Related U.S. Application Data

(60) Continuation of application No. 12/046,741, filed on Mar. 12, 2008, now Pat. No. 7,985,991, which is a continuation of application No. 11/543,030, filed on Oct. 5, 2006, now abandoned, which is a continuation of application No. 10/855,432, filed on May 28, 2004, now abandoned, which is a division of application No. 09/493,080, filed on Jan. 28, 2000, now Pat. No. 6,774,466.

(30) Foreign Application Priority Data

Jan. 28, 1999  (JP) .................................. 11-19431
Jun. 8, 1999   (JP) .................................. 11-160539

(51) Int. Cl.
*H01L 29/94* (2006.01)
*H01L 21/00* (2006.01)
*H01R 9/00* (2006.01)

(52) U.S. Cl. ........ 257/288; 257/676; 257/693; 257/696; 257/776; 257/E23.01; 257/E23.031; 257/E23.039; 257/E23.043; 361/773; 361/813; 438/123; 438/197

(58) Field of Classification Search ........................ None
See application file for complete search history.

(56) References Cited

U.S. PATENT DOCUMENTS 3,849,187 A    11/1974   Fetscher et al.
(Continued)

FOREIGN PATENT DOCUMENTS

JP    57-103342    6/1982
(Continued)

*Primary Examiner* — Alonzo Chambliss
(74) *Attorney, Agent, or Firm* — Antonelli, Terry, Stout & Kraus, LLP.

(57) ABSTRACT

A semiconductor device features a semiconductor chip including a MOSFET, a first electrode of the MOSFET disposed on an obverse surface of the chip, a second, control electrode of the MOSFET disposed on the obverse surface, a third electrode of the MOSFET disposed on a second, opposing surface of the chip, first, second, and third conductive members, each having top surface and opposing bottom surface, the first, second, and third conductive members connecting with the first, second, and third electrodes electrically, respectively, a sealing body having top and bottom surfaces and sealing parts of the first, second, and third conductive members, the first conductive member having first, second, and third contiguous portions, the first portion is positioned over the first electrode, the second is positioned between the first and second portions and the third portion is positioned under the obverse surface of the chip.

4 Claims, 22 Drawing Sheets

U.S. PATENT DOCUMENTS

| | | |
|---|---|---|
| 4,927,505 A | 5/1990 | Sharma et al. |
| 4,935,803 A | 6/1990 | Kalfus et al. |
| 5,053,851 A | 10/1991 | Berndlmaier et al. |
| 5,134,460 A | 7/1992 | Brady et al. |
| 5,172,214 A | 12/1992 | Casto |
| 5,373,190 A | 12/1994 | Ichiyama |
| 5,489,803 A | 2/1996 | Kanbe et al. |
| 5,532,512 A | 7/1996 | Fillion et al. |
| 5,539,254 A | 7/1996 | Eytcheson et al. |
| 5,814,884 A | 9/1998 | Davis et al. |
| 6,040,626 A | 3/2000 | Cheah et al. |
| 6,077,727 A | 6/2000 | Osawa et al. |
| 6,084,310 A | 7/2000 | Mizuno et al. |
| 6,249,041 B1 | 6/2001 | Kasem et al. |
| 6,288,905 B1 | 9/2001 | Chung |
| 6,423,623 B1 | 7/2002 | Bencuya et al. |
| 6,744,124 B1 | 6/2004 | Chang et al. |
| 6,774,466 B1 | 8/2004 | Kajiwara et al. |
| 6,992,385 B2 | 1/2006 | Satou et al. |
| 7,256,501 B2 | 8/2007 | Okamoto et al. |
| 7,332,757 B2 | 2/2008 | Kajiwara et al. |
| 7,342,267 B2 | 3/2008 | Kajiwara et al. |
| 7,394,146 B2 | 7/2008 | Kajiwara et al. |
| 7,400,002 B2 | 7/2008 | Kajiwara et al. |
| 7,985,991 B2 * | 7/2011 | Kajiwara et al. .............. 257/268 |
| 2005/0218494 A1 | 10/2005 | Satou et al. |

FOREIGN PATENT DOCUMENTS

| | | |
|---|---|---|
| JP | 1-266752 | 10/1989 |
| JP | 02-281737 | 11/1990 |
| JP | 2-310956 | 12/1990 |
| JP | 04-004764 | 1/1992 |
| JP | 05-047958 | 2/1993 |
| JP | 5-121615 | 5/1993 |
| JP | 05-343578 | 12/1993 |
| JP | 06-291223 | 10/1994 |
| JP | 07-078900 | 3/1995 |
| JP | 8-064634 | 3/1996 |
| JP | 08-064634 | 3/1996 |
| JP | 08139241 A | 5/1996 |
| JP | 09-129798 | 5/1997 |
| JP | 11-054673 | 2/1999 |

\* cited by examiner

FIG. 10(a)
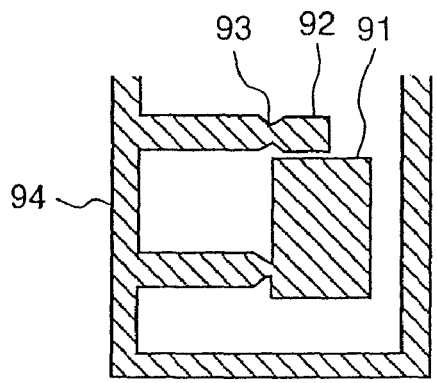
LEAD FRAME FOR SOURCE/GATE
FIG. 10(b)
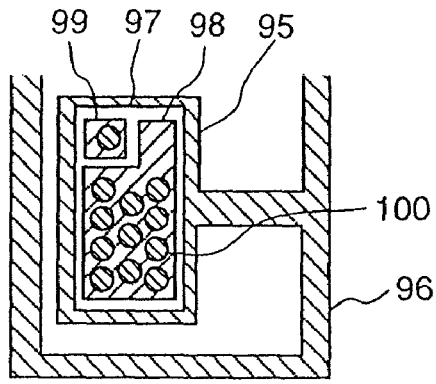
LEAD FRAME FOR DRAIN
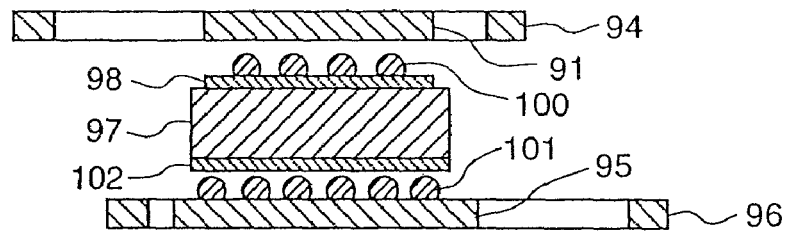
LAMINATED CROSS SECTIONAL
STRUCTURE AT BONDING
FIG. 10(c)

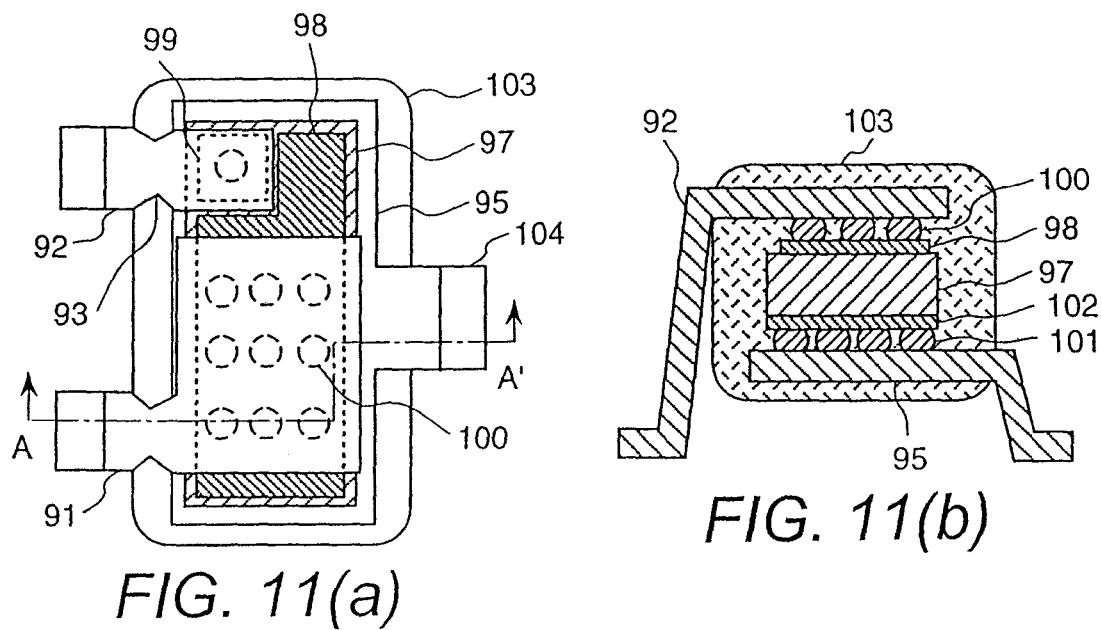
FIG. 11(a)
FIG. 11(b)
FIG. 12(a)
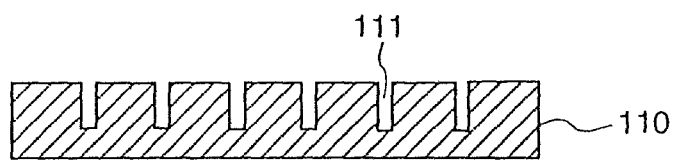
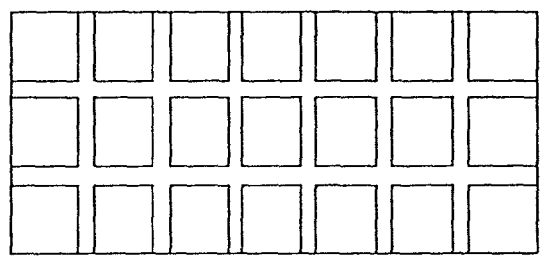
FIG. 12(b)

FIG. 13
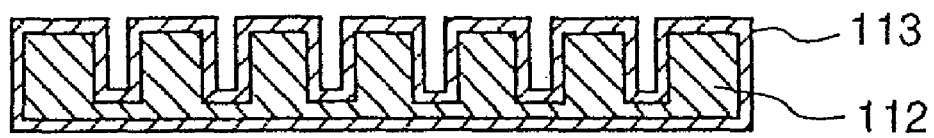
FIG. 14(a)
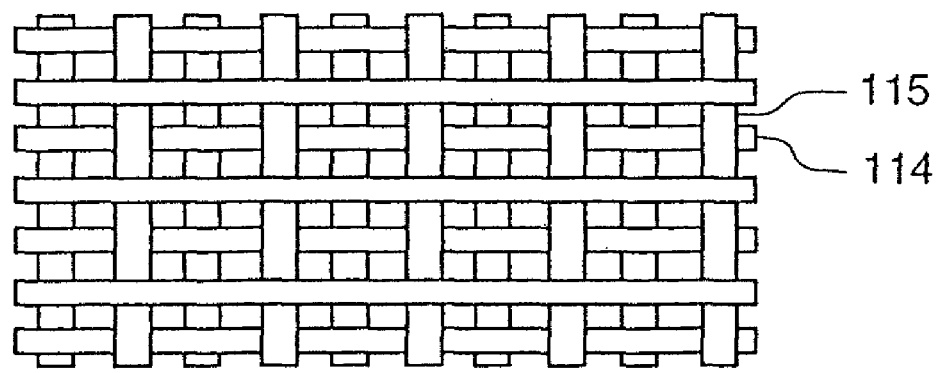
FIG. 14(b)

SEMICONDUCTOR DEVICE

This application is a Continuation application of U.S. Ser. No. 12/046,741, filed Mar. 12, 2008 now U.S. Pat. No. 7,985,991, which, in turn, is a Continuation application of U.S. application Ser. No. 11/543,030, filed Oct. 5, 2006 now abandoned, which, in turn, is a Continuation application of U.S. application Ser. No. 10/855,432, filed May 28, 2004 (now abandoned), and which, in turn, is a Divisional application of U.S. application Ser. No. 09/493,080, filed Jan. 28, 2000 (now U.S. Pat. No. 6,774,466); and the entire disclosures of which are incorporated herein by reference.

BACKGROUND OF THE INVENTION

The present invention relates to a semiconductor device, particularly, to a semiconductor package having a structure which is adequate for decreasing the electrical resistance of the semiconductor package without a Si chip.

An example of a conventional transistor package is disclosed in JP-A-8-64634 (1994). A semiconductor chip, whereon electronic circuits are formed, is bonded to a die pad for heat release at a rear plane electrode side by welding. A bump is formed on an Al electrode at a circuit formed plane side of the chip, and an inner lead is connected electrically and mechanically thereon. An inner lead is also connected to the die pad, and the chip, the die pad, and a part of the lead is sealed with resin so as to cover them. In a case when the bump is solder, the lead side is plated with tin (Sn), gold (Au), or solder, and the like, and bonded with the bump by melting the solder of the bump. In a case when the bump is gold, the lead is plated with tin, and bonded with the bump by an Au—Sn eutectic reaction. The inner lead is composed of three lines provided for a source electrode, a drain electrode, and a gate electrode, respectively. The lead for the source electrode is manufactured in a comb teeth shape. A through opening to the resin is formed on the head. JP-A-5-121615 (1993) discloses a surface mounting type semiconductor package having a wireless structure as another conventional example. Three external connection terminals are connected to electrode terminals of the semiconductor chip. Two electrodes on an upper surface of the chip are connected to the external connection terminals by thermocompression bonding of Au balls. Mounting on a circuit substrate is performed by soldering the tip region of the lead terminals, which protrude forward and backward from the chip mounting portion, to the terminals of the substrate.

In accordance with a conventional standard surface mounting type semiconductor package, the semiconductor chip is bonded to the die pad of the lead for the drain by soldering, and the source electrode and the gate electrode of the semiconductor chip are connected to the leads for the source and the gate of the external connection terminals by Al wire bonding. The chip, each respective lead, and a part of the die pad are molded with resin. The die pad is exposed at the bottom of the resin body so as to allow the structure of the resin body to be connected to the circuit substrate, and its size is set to be larger than the size of the resin mold.

In accordance with the conventional chip die pad bonding structure of a semiconductor chip, a bonding structure using a resin with conductive particles, wherein Pb rich solder having a low yield strength or Ag particles are mixed, has been adopted in order to prevent the chip from generating a high stress when the chip is fixed to a member made of a Cu base alloy.

The electrical resistance of the semiconductor package without a Si chip in the surface mounting type plastic package of a conventional vertical semiconductor element has been from several tens m$\Omega$ to ten and several m$\Omega$ with a wire bonding structure. In accordance with advancement of semiconductor technology, the on-resistance of the element has been decreasing year by year, and at present, a device of several tens to several m$\Omega$/cm$^2$ has been developed. Further decrease of the resistance can be expected in future. In that case, a decrease of the electrical resistance of the semiconductor package without a Si chip is indispensable for improving the performance of the semiconductor package, because the electrical resistance of a semiconductor package without a Si chip becomes larger than the device resistance. A prior technique regarding the on-resistance of the semiconductor package is disclosed in JP-A-8-64634. The prior proposed technique relates to an insert mounting type package. The insert mounting type package is not restricted in size, and a thick and large size die pad can be used, because the bonding between the substrate and the lead is strong structurally. Therefore, a decrease of the electrical resistance of the semiconductor package without a Si chip is relatively easy. However, the surface mounting type package has a property that the fatigue strength of the bonding portion is weaker than that of the insert mounting type package, because it has a structure in which the tip of the leads protruding from both sides of the resin body are bonded to the terminal of the substrate by soldering two planes of small area to each other. Therefore, it is necessary to absorb the thermal strain between the package and the substrate resulting from heat generation of the chip which causes deformation of the flexible leads. Accordingly, it is necessary to make the shape of the leads thin and slender. In this case, a decrease of the electrical resistance of the semiconductor package without a Si chip is difficult, because the electrical resistance of the lead itself is large.

In the case of a surface mounting type package, the above problem can be solved by adopting a structure wherein the die pad mounting the chip is soldered directly to the circuit substrate. However, if a position where the lead, to be connected to the electrode at an upper surface of the chip, protrudes from the resin body differs in height from the position where the die pad protrudes, the contacting planes of the upper and lower metal molds for molding the resin form a three dimensional structure, such that a problem is created in that the manufacture of the metal molds becomes difficult. The above problem becomes significant when the lead frame is a matrix frame (arranged in X and Y directions) and the objective is to manufacture a large number of the packages, simultaneously. The problem can be solved by making the size of the die pad to be contained in the resin body small, but if so, a pressing portion to press the die pad onto the bottom surface of the metal mold must be provided in the metal mold, in order to expose the die pad at the lower plane of the resin body. If the size of the die pad is sufficiently large, it is possible to press the die pad onto the bottom surface of the metal mold. However, if the size of the die pad is the same as the size of the chip, the pressing portion can not be found on the die pad, and a problem is created in that the die pad is molded while being exposed at the bottom of the resin body. Therefore, in case of a small size semiconductor package, wherein the size of the die pad is the same as the size of the chip, it is difficult to assembly the structure in such a manner that the die pad concurrently operating as the external connection terminals of the rear electrode is contained in the resin body.

On the other hand, conventionally, a soldering connection or an adhering structure with a resin using conductive particles has been adopted for the connection of the rear plane of the chip with the external connection terminals, such as a die pad, and others. The soldering connection is a superior connection with regard electrical resistance, thermal resistance, and heat resistance reliability. However, currently, in view of environmental problems, no use of Pb is employed, and the conventional soldering material containing Pb must be replaced with a new bonding material containing no Pb. There are various soldering materials containing no Pb having a solidus line temperature below 250° C., but actually, there is no adequate soldering material containing no Pb having a solidus line temperature higher than 270° C., which is durable against severe mounting on the substrate of the package. The only exception is Au—Si solder having a solidus line temperature of 370° C. However, Au—Si solder can not be adopted as the soldering material for the electrode at the rear plane of the chip, for two reasons, such as high cost and generation of cracks in the chip during the cooling step after soldering when the size of the chip is large, because of the high yield strength. Therefore, a problem exists in that there is no soldering material containing no Pb to replace the soldering material containing Pb. On the other hand, adhesion with a resin with conductive particles is durable thermally in a short time against the necessary temperature for the mounting, i.e. 270° C., but is weak in mechanical strength, because the adhesion strength is maintained by the resin. Even though tightness of the adhesion is reinforced with a shrinking force by curing the molding resin, a package having a large area or a package used in a high temperature has a problem in that the electric resistance and thermal resistance at the bonding portion are increased in accordance with deterioration of the resin, which is caused by a change with elapsing time or temperature cycles. In particular, because the one plane molding structure, wherein the die pad (external connection terminals) is exposed to the surface of the resin body, is a structure which can not receive sufficient pressing force from the molding resin at the rear plane of the chip, a problem is raised in that the long term reliability of the resin using conductive particles for adhesion is further decreased.

SUMMARY OF THE INVENTION

The present invention has been achieved in consideration of the above problems, and has the object of providing a semiconductor device comprising a package structure which can decrease the electrical resistance of the semiconductor package without a Si chip.

The semiconductor device in accordance with the present invention is provided with a semiconductor element, which comprises a semiconductor substrate, a first electrode provided at the front plane of the semiconductor substrate, and a second electrode provided at the rear plane of the semiconductor substrate. A first metallic member is connected to the first electrode of the semiconductor element via a first metallic body containing a first precious metal, and a second metallic member is connected to the second electrode of the semiconductor element via a second metallic body containing a second precious metal.

In accordance with the present invention, the electrical resistance of the semiconductor package without a Si chip can be decreased, because the first and second members are connected to the electrodes of the semiconductor element via the metallic bodies containing different precious metals.

In accordance with the above composition, the surface portion of the first metallic member and the surface portion of the second metallic member for connecting to the external wiring are desirably positioned in approximately the same plane. The term "approximately the same plane" means, for instance, a plane of the wiring substrate or circuit substrate of various electronic devices, whereon electronic members are mounted. Accordingly, the semiconductor device can be mounted onto the wiring substrate or the circuit substrate.

As the first metallic body, there is an protrusion electrode which protrudes from the first electrode or the first metallic member of the semiconductor device. As the protrusion electrode, there are bump electrodes, or ball electrodes made of precious metal, such as gold (Au) or silver (Ag), and others can be used. In order to decrease the electrical resistance of semiconductor package without a Si chip, a plurality of the protrusion electrodes are desirably arranged with approximately the same interval relative to each other on the whole surface of the bonding interface of the first electrode with the first metallic member.

As the second metallic body, a metal layer positioned at the bonding interface of the second electrode with the second metallic member can be used. The metal layer is desirably composed by bonding the respective precious metal layers positioned at bonding front plane sides of the second electrode and the second metallic member, respectively. As the material of the precious metal layer, a precious metal selected from a group consisting of gold (Au), silver (Aq), platinum (Pt), palladium (Pd), and the like, or an alloy containing the above element as a main component can be used. A layer composed of plural kinds of precious metals, or multi-layers of the alloy layer is also usable. Furthermore, any bump electrode or ball electrode made of precious metal, such as gold (Au) or silver (Aq), silver (Ag) particles mixed with resin, a silver (Ag) member in a shape of plate, sheet, or network, and a silver member shaped in plate or sheet having bumps and dips, or cavity portions thereon, may be interposed between the precious metal layer positioned at the second electrode side and the precious metal layer positioned at the second metallic member side. As the desirable other metal layer, an alloy layer containing precious metal as a main component, of which the solidus line temperature is higher than 400° C., is usable. As the material of the alloy layer, an alloy of silver (Ag) and tin (Sn) containing silver as the main component can be used.

A precious metal layer may be provided on the bonding surface of the first and second electrodes, and of the first and second metallic members of the semiconductor device. As the material of the above precious metal layer, a precious metal selected from a group consisting of gold (Au), silver (Ag), platinum (Pt), palladium (Pd), and the like, or an alloy containing the above element as a main component can be used. As the material of the first and second electrodes of the semiconductor device, aluminum, or an aluminum alloy such as aluminum-silicon can be used.

The first and second metallic members electrically connect the first and second electrodes of the semiconductor element to external electrodes, the wiring substrate, the circuit substrate, and others. For instance, the first and second metallic members are lead wire, lead electrodes, or die pad terminals, which are a part of the semiconductor package, and others, or a part of these members. In order to decrease the electrical resistance of a semiconductor package without a Si chip, the first metallic member desirably comprises plural portions extending from the portion having the bonding portion with the first electrode, and the plural portions each comprise a surface portion for connecting with external wiring. In accordance with the circuit substrate or wiring substrate connecting to the semiconductor device, each surface portion as described above of the first metallic member is provided with a conductor portion (for instance, copper foil) for electrical connection. The conductor portions are connected electrically on the circuit substrate or the wiring substrate. For instance, a continuous conductor (for instance, copper) pattern can be used as the conductor portion of the printed substrate.

The composition of the semiconductor device in accordance with the present invention as described above can be applied to semiconductor devices, wherein the semiconductor element and the first and second metallic members are coated with an insulating material, such as the resin sealing type or resin molding type semiconductor devices. In these cases, the rear plane of the bonded plane of the first metallic member bonded with the first electrode has desirably an exposed portion for connecting with external wiring. In addition to the above composition, the bonded plane side of the semiconductor element is used as a circuit forming plane (for instance, a plane whereon one of the main current electrodes and a control electrode of the vertical semiconductor switching element are formed), and the first electrode is desirably used as the main current electrode. In accordance with the semiconductor device, wherein the semiconductor element and the first and second metallic members are coated with an insulating material, the rear plane of the bonded plane of the second metallic member bonded with the second electrode may have an exposed portion for connecting with external wiring. As the insulating material, ceramics and other insulators can be used, in addition to various resins.

The various composition described above can be used concurrently. However, some compositions have a function and an advantage to decrease the electrical resistance of the semiconductor package without a Si chip by itself, such as the other semiconductor device of the present invention described hereinafter.

As the other semiconductor device of the present invention, the semiconductor package, which contains a semiconductor element comprising a first electrode and a second electrode on the front plane and the rear plane of the semiconductor substrate, respectively, can be composed in any one of the following ways:

1) A composition, wherein the second electrode and the second metallic member are bonded via a metallic layer; the metallic layer is composed by bonding precious metal layers, one of which is provided on the bonding front plane of the second electrode, and another one of which is provided on the bonding front plane of the second metallic member.

2) A composition, wherein the second electrode and the second metallic member are bonded via an alloy layer; the alloy layer is composed of an alloy containing precious metal as a main component, of which the solidus line temperature is higher than 400° C.

3) A composition, wherein the first metallic member comprises plural portions extending from the bonding portion with the first electrode, and each of the plural portions comprises a surface portion for connecting with external wiring.

The composition of 1) or 2), and the composition 3) can be used concurrently.

Each of the semiconductor devices of the present invention described above can be applied to various semiconductor elements, such as a MOS (Metal Oxide Semiconductor) field effect transistor, a MIS (Metal Insulator Semiconductor) field effect transistor, a bipolar transistor, an insulated gate bipolar transistor, a diode, or integrated circuits, and the like. The composition of each of the semiconductor devices of the present invention is preferably applied to the semiconductor element, wherein the first electrode and the second electrode are used as a pair of main current electrodes; and to the vertical type semiconductor element, such as a power MOSFET and power transistor, wherein the first and the second electrodes are used as the main current electrodes, and the main current passes vertically in the semiconductor substrate in a direction from the first electrode at the front plane side to the second electrode at the rear plane side, or in a reverse direction. In this case, the on-resistance or on-voltage between the terminals including the package can be decreased, accompanied with low on-resistance characteristics of the semiconductor element.

In accordance with the semiconductor device of the present invention, the bonding strength of the Au bump/Al electrode bonding portion is improved by changing the Al film between the Au bump/Si substrate to an Au—Al compound in all the thickness direction of more than 80% of the bonding area by heating treatment of the Au bump/Al electrode bonding portion at a high temperature. Furthermore, the temperature cycle life is improved by forming a structure, wherein a compression load is added to the bonding portion by filling a resin between the electrode lead and the chip.

BRIEF DESCRIPTION OF THE DRAWINGS

FIGS. 10(a), 10(b) and 10(c) are cross-sectional views showing an embodiment of the assembled structure of the semiconductor package containing no Pb according to the present invention;

FIG. 11(a) is a top plan view and FIG. 11(b) is a cross-sectional views of an embodiment of the semiconductor package containing no Pb according to the present invention;

FIG. 12(a) is a cross-sectional view and FIG. 12(b) is a top plan view of an embodiment of the bonding member containing no Pb for the electrode at the rear plane of the chip according to the present invention;

FIG. 13 is a cross-sectional view of another embodiment of the bonding member containing no Pb for the electrode at the rear plane of the chip according to the present invention;

FIG. 14(a) is a cross-sectional view and FIG. 14(b) is a top plan view of another embodiment of the bonding member containing no Pb for the electrode at the rear plane of the chip for the present invention;

DESCRIPTION OF THE PREFERRED EMBODIMENTS

The first embodiment of the present invention is a structure assembled by the steps of: directly connecting a gate electrode and a source electrode of a transistor chip to a metallic member for external connection (lead) via plural Au bumps arranged in an optimum manner; electrically and thermally connecting a drain electrode at the rear plane of the chip to the metallic member for external connection (die pad) to enclose the source electrode and any one of the metallic member for the gate electrode (lead) or the metallic member for the drain electrode (die pad) inside of a polyhedral package. In accordance with the above structure, the planes of the metallic member contained in the package can be bonded by soldering to a terminal plane of a wiring substrate. Desirably, the structure is assembled so as to extend tips of the leads or the die pad from the two side planes of the package, and to make it possible to press the metallic member contained in the package onto the bottom plane of the metal molds via the metallic member which protrudes from the package.

The second embodiment of the present invention is a structure, wherein the drain electrode is bonded to the precious metal plated metallic member (die pad) via any one of precious metal bumps, a mesh sheet made of precious metal, precious metal particles, a thick precious metal plating having a hardness less than 60 Hv directly, or via an alloy layer having a solidus line temperature of at least 400° C., which contains a precious metal as a main component. The bonding portion can be obtained by compression bonding using heating and ultrasonic vibration. Desirably, when the chip size is large, the structure is assembled by forming the Au bumps onto the source electrode and the gate electrode on the circuit forming plane of the chip, and bonding the electrodes directly to the lead plated with precious metal. Furthermore, the structure is assembled so that the size of the lead at the source electrode side is made equal to the size of the die pad at the rear plane of the chip, and the members are arranged symmetrically, in order to prevent the chip from being subjected to an increased bending stress.

The third embodiment of the present invention is a structure and a method for assembling the structure by the steps of: forming a large number of Au bumps onto a source electrode and a gate electrode made of Al on the chip; mounting the chip so as to be aligned with respective leads plated with precious metal; mounting a precious metal member having a smaller hardness than the Au bump thereon; mounting a die pad plated with precious metal thereon; and bonding all the contacting boundary planes simultaneously with heating, loading, and ultrasonic vibration by arranging a bonding tool, which applies pressure and ultrasonic vibration, on the die pad.

The first embodiment will be explained in detail hereinafter.

Figure 20:
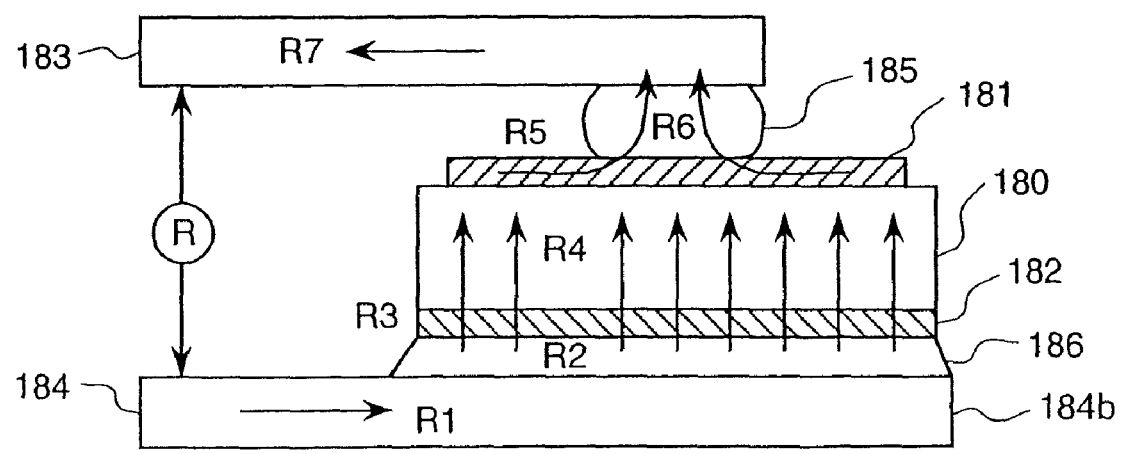
FIG. 20 is a diagram showing a current path model of the semiconductor package.

A current path model of the semiconductor package is shown in FIG. 20. Respective reference marks are used to identify the following members.

184: external connection terminal for drain,
186: bonding portion,
182: electrode at the rear plane of the chip,
180: chip,
181: Al electrode,
185: metallic bump, and
183: external connection terminal for source (lead).

The electric resistance R between the external connection terminals for the source and the external connection terminals for the drain is expressed by the following equation (1):

$$R = R1 + R2 + R3 + R4 + R5 + R6 + R7 \quad (1)$$

The part obtained by eliminating the internal resistance R4 of the chip 180 from the equation (1) can be regarded as the electrical resistance of the semiconductor package without a Si chip. The resistance R6 of the bump 185 can be expressed by the following equation (2):

$$R6 = (\rho \times h/S)/n \quad (2)$$

where,
$\rho$: specific resistance of the bump
h: height of the bump
S: cross sectional area
n: number of the bumps The regular size of the Au bump is 150 µm in diameter and 20 µm in thickness, if the Au bump is formed by a ball bonding method with wire, which makes it possible to form the bump directly on the Al pad with a low cost. The resistance of the bump in the above case becomes (0.026/n) mΩ of sufficiently small size. The resistance R5 of the Al electrode film 181 can be expressed by the following equation (3):

$$R5 = (\rho/4\pi t)\ln(r2/r1) \quad (3)$$

where,
ρ: specific resistance of the electrode film
t: thickness of the electrode film
r2: the outer diameter of the electrode
r1: the diameter of the bump The outer diameter of the electrode is approximately proportional to $1/(n^{1/2})$ when n bumps are arranged uniformly. Therefore, if n is increased, the ratio r2/r1 comes to close 1, and the resistant R5 can be decreased sufficiently by increasing the thickness of the electrode film and the number of bumps. The resistance of the external connection terminals (R1+R7) can be expressed simply by the following equation (4):

$$(R1+R') = (\rho \times L/S) \quad (4)$$

where,
ρ: specific resistance of the lead
L: current-carrying length of the lead
S: current-carrying cross sectional area The resistance of the external connection terminals becomes approximately 1.4 mΩ in the case of a regular SOP package for surface mounting (thickness: 0.16 mm, width: 0.3 mm, length: 2 mm×2). That is, at a level where the electrical resistance of semiconductor package without a Si chip is less than 1 mΩ, the electrical resistance of semiconductor package without a Si chip can not be decreased only by adopting the bump structure, and a structure to decrease the resistance of the external connection terminals must be adopted.

Thus, in accordance with the semiconductor device of the present invention, a structure is used, which ensures the reliability of the connecting portion of the external connection terminals with the wiring substrate in addition to providing a decrease in the resistance of the external connection terminals.

Figure 21A:
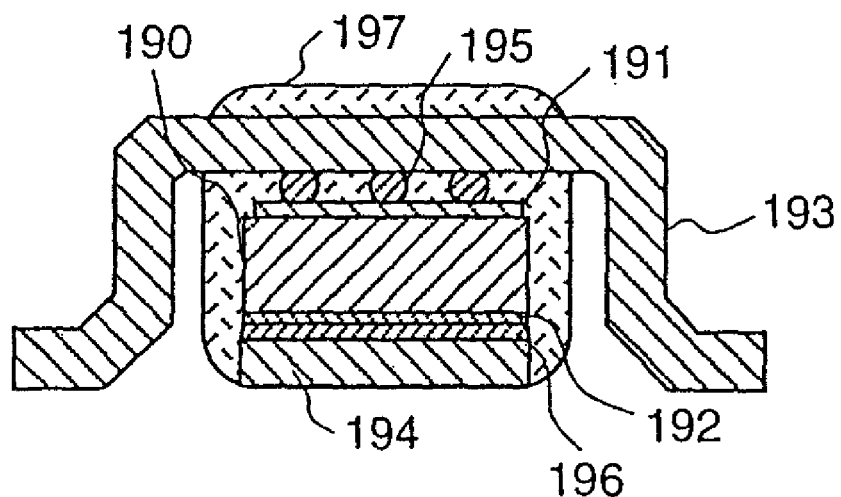
FIG. 21(a) is a cross-sectional view and FIG. 21(b) is a bottom plan view showing a fundamental structure of the semiconductor package of the present invention.
Figure 21B:
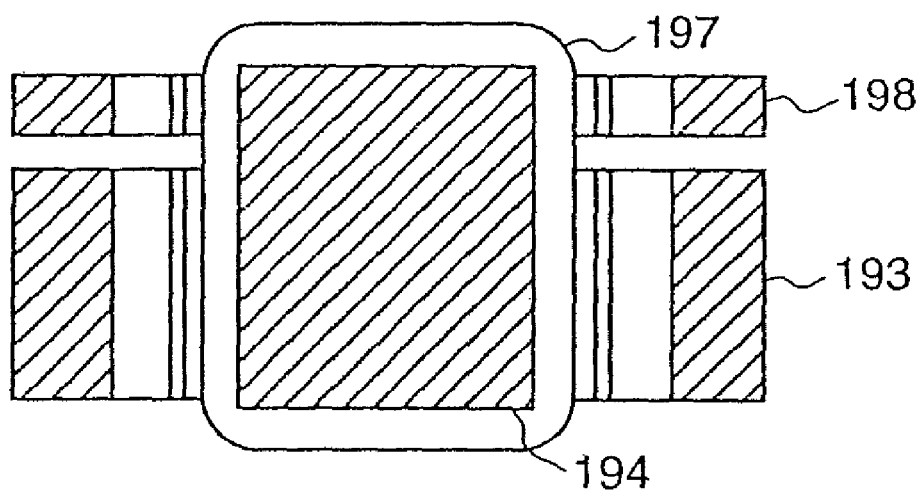

The fundamental structure of the semiconductor device 1 of the present invention is indicated in FIGS. 21(a) and 21(b). The only way to decrease the resistance of the external connection terminals is to increase the cross sectional area of the current path or to decrease the length of the current path. Therefore, one of the external connection terminals has a structure in which the current path is increased in the thickness direction of the terminal. In this case, the current-carrying cross sectional area is sufficiently large, such as from several to several tens mm² in comparison with the current carrying distance (0.1-0.2 mm), with the result that the resistance of the first external connection terminal portion 194 can be made less than 1μΩ. The second external terminal portion 193 has a structure in which connection is made with the terminal of the wiring substrate by descending along the side plane of the chip, whereby the current-carrying distance becomes several millimeters. However, two times the current-carrying cross sectional area can be ensured by using both sides of the package. In accordance with the present structure, a wide and thick member can be used as the second external connection terminal for a reason to be described later. Therefore, more than several times the current-carrying cross sectional area can be ensured, and the electric resistance can be decreased to approximately one-tenth in comparison with a conventional package structure.

The conventional package structure has a problem in that, if the rigidity of the second connection terminal is increased, the long term reliability at the connection portion with the wiring substrate is decreased. However, in accordance with the structure of the present invention, the temperature cycle reliability can be ensured even if the rigidity of the second connection terminal is high. The reasons for this are that the temperature difference from the substrate is small because the structure is composed so that the area of the first external connection terminal at the bottom of the resin body is sufficiently large, and the chip, i.e. a heat source, and wiring substrate are located close each other, and that the thermal distortion is small because the connecting terminal is made of a copper alloy having a thermal expansion coefficient close to that of the substrate. Accordingly, the absolute value of the thermal distortion generated at the connecting portion of the first and second connection terminals with the substrate is small. A pressing force is generated at the connecting portion of the second connection terminal and the substrate with increasing temperature because of the difference in thermal expansion in a height direction of the resin body from the Cu member corresponding to the folded legs, and based on this effect, the temperature cycle reliability is improved in comparison with a conventional package, and the rigidity of the second connection terminal can be increased.

During the molding step for assembling the package indicated in FIG. 21(a), the first connection terminal member 194 can be pressed toward the bottom plane of the metal molds via the precious metal bump 195 by pushing down the second connection terminal with the side wall of the upper die. Accordingly, the package, wherein the connection terminals are certainly exposed at the bottom plane of the resin body, can be assembled without adding any special measures to the die. In this case, a particularly important point is that the second connection terminal member connected via the bump protrudes from both side planes of the resin body. By pushing down at both sides of the second terminal member, generation of an inclination of the first terminal member and splitting off of the bump can be prevented, and faultless resin molding having a high production yield becomes available. In accordance with a structure to push down at one side, a moment is generated between the die contacting portion of the pushed down second terminal member and the lower die contacting portion of the first terminal member. Then, the bonding portion is split off by generation of a tensile stress at a part of the bump bonding portion, and a failure caused by resin flowing into the bonding plane is generated by separating one side of the first terminal member. Therefore, faultless resin molding with a high production yield can not be ensured.

Now, a second embodiment will be explained in detail. The characteristics required for bonding at the rear plane of the chip involve four points, as follows:
1) electrically conductive and thermally high-conductive to the external connection terminal (die pad),
2) long temperature cycle life,
3) durability against a soldering temperature at the time of mounting the package onto the substrate, and
4) possibility to bond a wide area of the rear plane of the chip during a short time in a mass-production line with no undesirable influence.

Because no appropriate high melting point soldering material containing no Pb is available, the bonding satisfying the above characteristics must be achieved using materials other than a soldering material. When a precious metal material is used as the bonding material, the thermal conductivity of the bonding material is approximately ten times that of the soldering material. Accordingly, even if the bonding has the same thickness, the same heat transfer characteristics can be obtained using one tenth of bonding area if the bonding portions distribute heat uniformly at the rear plane of the chip. That is, it is significantly advantageous in heat releasing characteristics.

Regarding the temperature cycle life, it is significantly influenced by what component can absorb thermal strain caused by a difference of thermal expansion of the chip and the external connection terminal (die pad) by deformation. In the use of conventional solder, most of the strain could be absorbed by deformation of the solder, because the yield strength of the solder is very low, and the destruction occurs at the soldering portion. In this case, the strain was scarcely transmitted to the chip, and there was an advantage in that the stability and reliability of the chip was maintained. On the contrary when a precious metal material is used for the bonding, the yield strength is higher than solder, and lower than Si and Cu. Accordingly, the strain on the chip and the die pad is increased, but the life of the bonding portion is extended. The amount of the strain added to the chip can be adjusted by providing cavities in the precious metal layer so long as the heat releasing characteristics do not haves serious problem. One of the practical measures is to provide cavities using a mesh sheet, particles, or a sheet having bumps and dents as the bonding material.

Regarding heat resistance, there is no problem. The most important point is readiness of bonding and assembling. When precious metals were bonded to each other using a conventional thermocompression bonding method, it was necessary to set the heating temperature in the range of 400-500° C., in order to bond in a short time. In accordance with this method, the amount of thermal strain during the cooling step was large, because the temperature difference from room temperature was significant, creating a large danger of destruction of the chip even in a case when the size of the chip is not remarkably large. In accordance with the present invention, a method has been adopted in which the bonding temperature is specified as being equal to or below 250° C. in order to solve the above problem, and ultrasonic vibration is utilized for achieving ensured bonding at the above temperature. However, when the chip is bonded to the die pad by a thermosonic bonding method, a problem is generated in that the chip is damaged at the portion where the circuit forming plane of the chip contacts the hard bonding jig, because the ultrasonic vibration is added to the compression of the die pad and the chip by holding them with a hard heating stage and a hard bonding jig. In accordance with the present invention, the above problem is solved by forming an Au bump onto the electrode at the circuit forming side of the chip; arranging an external connection terminal member (lead) having the same size with the die pad at the circuit forming side; and forming a structure, wherein the chip does not directly contact the hard bonding jig, in order to prevent the chip from being damaged. When the bonding portions are provided at both upper and lower planes of the chip, respectively, generation of a variation in the bonding condition (a condition that one side is bonded tightly and another side is not bonded well) is a concern. However, in accordance with the ultrasonic vibration bonding method, if the bonding portions are arranged in series to the bonding jig, a self adjusting function is achieved such that relative vibration at one portion is restricted in accordance with the bonding at the portion, and the relative vibration at the other portion, which is not bonded yet, is increased. Accordingly, two bonding portions having approximately the same strength can be obtained. However, when it is desired to enlarge the bonding area at the rear plane of the chip in view of the heat release, it is possible to provide different bonding areas by making the bonding materials at the upper plane and the rear plane of the chip different from each other, whereby the bonding at the circuit forming plane side of the chip is performed with a bonding material having a higher yield strength, and the bonding at the rear plane side of the chip is performed with a bonding material having a lower yield strength. By adopting the above bonding structure and bonding method, the bonding at the rear plane of the chip with a high performance and high reliability becomes possible without using Pb.

The operation and the advantages of the third embodiment are the same as described in the second embodiment. The practical bonding time is approximately several hundreds milliseconds except the time necessary for transferring and positioning the work, and is shorter than the time necessary for conventional plural wire bonding operation. It is necessary to form the Au bumps on the Al electrode of the chip, previously, but it does not influence to the production tact, and in view of a point that the chip-die pad connection and the bonding can be performed simultaneously, the production tact can be decreased in comparison with the conventional operation.

Embodiments

Hereinafter, Practical Structures of the Above Embodiments of the Present invention will be explained in detail with reference to the drawings.

Figure 1A:
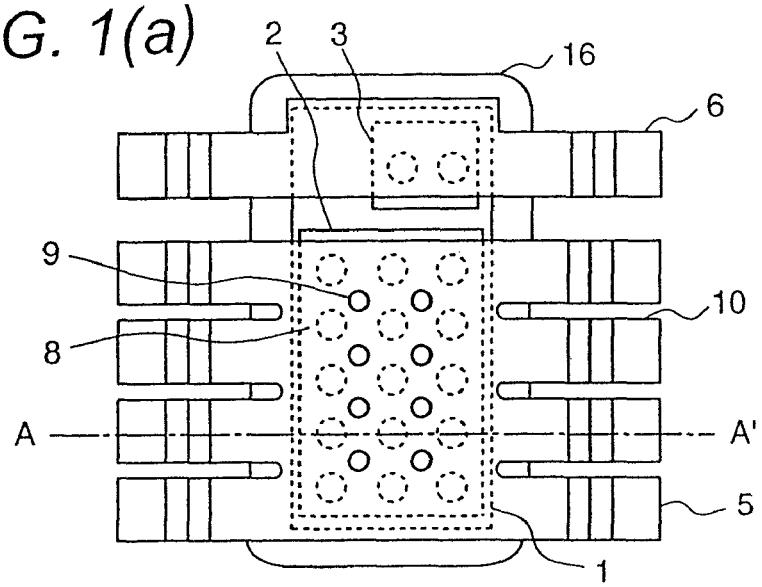
FIG. 1(a) is a top plan view.
Figure 1B:
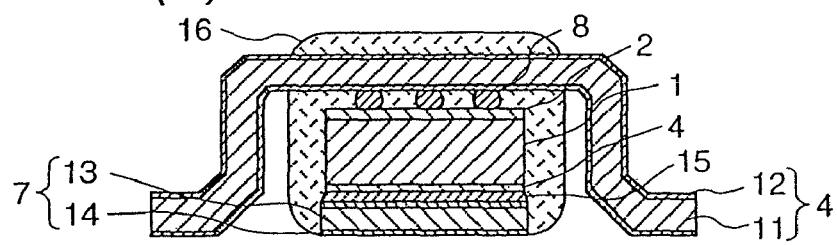
FIG. 1(b) is a cross-sectional view.
Figure 1C:
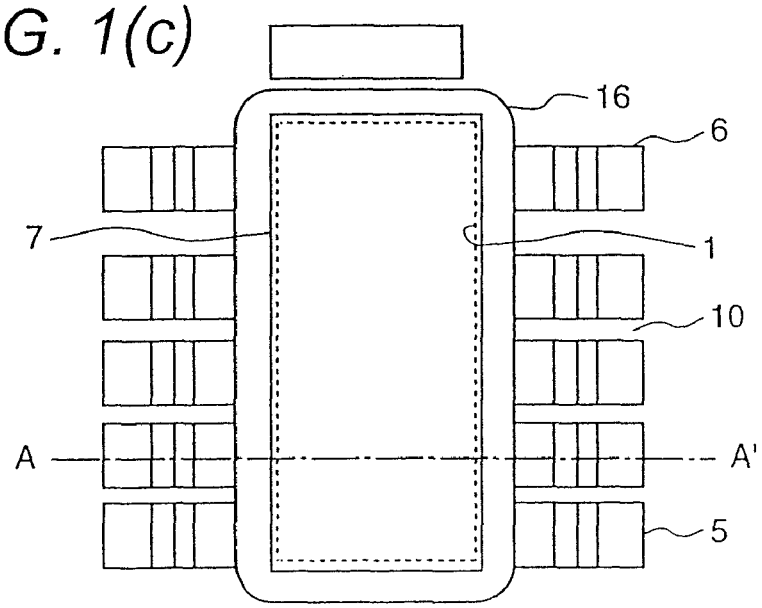
FIG. 1(c) is a bottom plan view of an embodiment of the semiconductor package of the present invention.

FIG. 1(*a*) is a top plan view, FIG. 1 (*b*) is a cross sectional view, and FIG. 1(*c*) is a bottom plan view of an embodiment of the semiconductor package of the present invention. In accordance with the drawings, the semiconductor chip 1 is a vertical MOS transistor of 4×2 mm in size. The film thickness of the Al electrodes 2, 3 for the source and gate is approximately 4 μm, and Au is vapor deposited onto the surface of the rear plane electrode 4, which is to be the drain electrode. A large number of Au bumps 8 are formed onto the source electrode and the gate electrode of the chip by a ball bonding method, that is, in a manner such that the bumps are arranged with an approximately equal interval over all of the surface of the electrodes. Each of the lead terminals 5, 6, for the source and the gate has a structure, wherein the Cu core 11 is plated with a precious metal 12 of Pd/Au, and its thickness is 0.2 mm. The width of the lead terminal for the source 5 is approximately the same as the source electrode 2. That is, the lead terminal for the source 5 covers almost all the surface of the source electrode 2. The Au bump on the chip and the Pd/Au plane of each lead terminal is bonded directly by a thermosonic thermocompression bonding method with heating at 230° C. The size of the Au bump bonded by the compression bonding method is approximately 120 μm in diameter and 40 μm in thickness. The external connection die pad terminal 7 has a structure, wherein the Cu core 13 is plated with precious metal 14 of Pd/Au, and its one plane is further plated with Ag 15 to approximately 10 μm. The Au plane of the rear plane electrode of the chip and the Ag plated plane of the die pad terminal are bonded directly by a thermosonic thermocompression bonding method with heating at 230° C., the same as the case of the Au bump/lead terminal. The lead terminal for the source protrudes outside from both left and right side walls of the molded resin body 16, and is manufactured to be folded. The lead terminal having a wide width which protrudes leftward and rightward, is provided with the slit 10 and some openings 9 at locations above the chip. The lead terminal for the gate also protrudes outside from both left and right side walls of the molded resin body 16. The die pad terminal for the drain is exposed at the bottom of the resin body. The lower plane of the die pad terminal (a contacting plane with the connection terminal on the wiring substrate), and the lower planes (the same contacting plane) of the lead terminals for the source and gate, which are manufactured to be folded, are manufactured to be the same height, that is, to be the same plane.

In accordance with the present embodiment, the electrical resistance of semiconductor package without the Si chip can be decreased significantly on account of its structure, wherein the source electrode and the lead terminals for the source are connected by a large number of Au bumps arranged uniformly; the lead terminals having a wide width protrudes from both the left side and the right side; the die pad terminals are connected directly to the rear plane electrode by the Ag plated film; the cross sectional area of the current path to the wiring substrate is large; and the conducting distance is very short (equal to only thickness of the substrate). Accordingly, a novel semiconductor device provided with an unprecedented semiconductor package having a low electrical resistance without the Si chip, such as lower than 1 mΩ, can be obtained. Additionally, an advantage in that the semiconductor package is superior in long term reliability is realized, because the presence of the Au bumps of 40 μm in thickness on the circuit plane and the Ag plated film of 10 μm in thickness on the rear plane of the chip at the connecting portion of the chip to the Cu terminal operates as a cushion material, because Au and Ag are soft materials (yield strength is low) in comparison with the Cu terminal material, and an effect to prevent the chip from being influenced by a large force is realized; and Au and Ag have a longer temperature cycle life than that of solder. When the semiconductor package is mounted onto the wiring substrate, the package is bonded with the substrate via a wide area of the die pad terminal, and the chip, i.e. a heater, and the substrate are connected by the shortest distance under a preferable thermal conducting condition. Accordingly, the thermal strain generated between the substrate and the package is small, because the temperature difference between the package and the substrate is small, and the thermal expansion coefficient of the substrate and the thermal expansion coefficient of the Cu terminal are close to each other. Therefore, an advantage is realized in that the connecting portion of the semiconductor package with the wiring substrate has a long temperature cycle life and a superior long term reliability. Furthermore, because the openings are provided at the lead terminal for the source positioned above the chip, generation of voids in the resin molding step can be prevented by two effects, such as supplying the resin through the openings and degassing through the openings can be performed even if the Au bumps are flattened and the gap between the lead terminal and the chip is decreased. Accordingly, the reliability of the package can be maintained.

A semiconductor package having a connecting structure of high heat resistance and high temperature cycle reliability can be provided, because thermosonic bonding Au/Ag is performed via a Ag plated film serving as the connecting structure of the rear plane electrode of the chip with the die pad terminal, which results in solderless bonding.

Here, the size of the Au bump is 120 μm in diameter. However, a larger size bump such as several hundreds μm in diameter is desirable, if formation of the bump is possible. By increasing the size of the bump, the resistance can be further decreased, the bonding strength is increased, and an advantage is realized in that the production yield is increased, because peeling off the bump bonding portion by an external force during assembly of the package can be prevented effectively.

Figure 2:
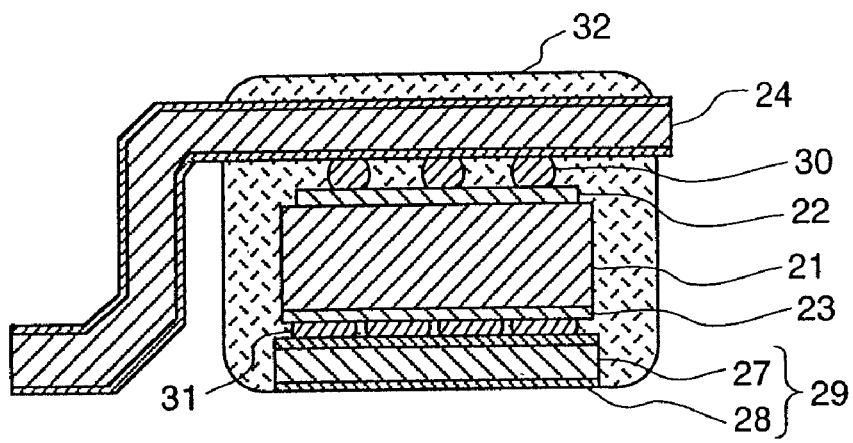
FIG. 2 is a cross-sectional view of another embodiment of the semiconductor package of the present invention.

FIG. 2 indicates an embodiment of the semiconductor package of the present invention, wherein the Ag bump compression bonding method is applied to the chip-die pad connection. In accordance with FIG. 2, the Al electrode 22 of the semiconductor chip 21 and the lead terminal 26 plated with precious metal 25 are bonded tightly to each other via the Au bumps 30. The rear plane electrode 23 of the chip and the die pad terminal 29 plated with precious metal are bonded to each other via the Ag bumps 31. The reference numeral 27 in FIG. 2 indicates a Cu core, and the reference number 28 indicates a precious metal. The one side of the lead terminal is cut off at a portion near the side wall of the resin body 32, and the other side of the lead terminal is manufactured to be folded and aligned at the same height as the die pad in order to connect with the terminals of the wiring substrate.

In accordance with the present embodiment, deformation can be absorbed structurally, because the chip and the die pad are connected by the Ag bumps. Therefore, the temperature cycle life at the bonding portion of the die pad terminal/chip is significantly long, and a semiconductor package containing no Pb, which is desirable in view of environmental problems, and having a high reliability can be provided. The mounting reliability is improved significantly, because thermal strain is hardly added to the solder bonding portions of the connecting terminals of the wiring substrate. The size of the package can be decreased to an equivalent size as the chip, the thickness of the package can be decreased to approximately 1 mm, and a small size semiconductor package for surface mounting, which is appropriate for high density mounting, can be provided.

Figure 3:
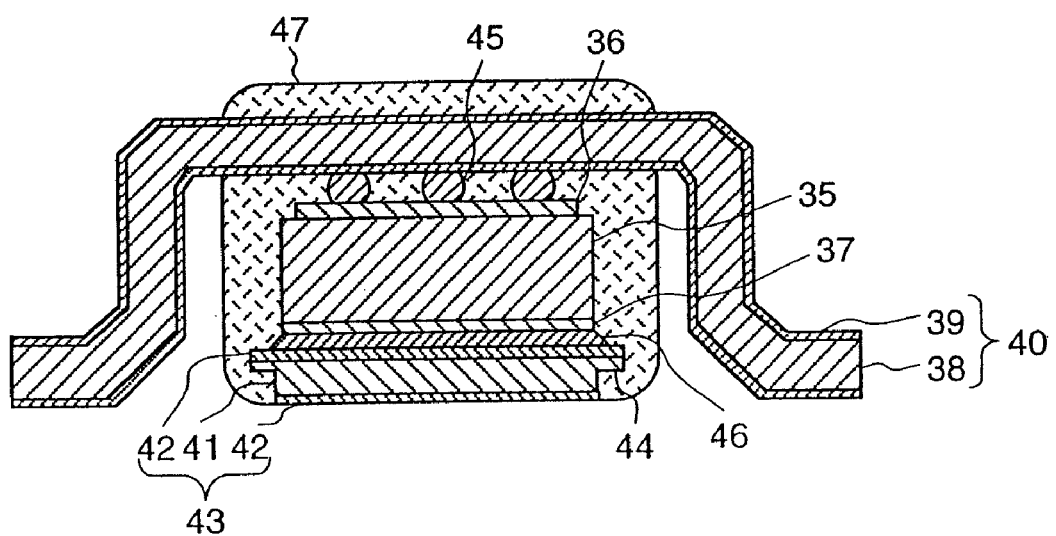
FIG. 3 is a cross-sectional view of another embodiment of the semiconductor package of the present invention.

FIG. 3 indicates an embodiment of the semiconductor package of the present invention, wherein the Ag paste adhering method is applied to the chip-die pad connection. In accordance with FIG. 3, the Al electrode 36 of the semiconductor chip 35 and the lead terminal 40 plated with precious metal 39 are bonded tightly to each other via the Au bumps 45. The reference numeral 38 in FIG. 3 indicates a Cu core, and the reference numeral 44 indicates a peripheral plane of the die pad terminal. The rear plane electrode 37 of the chip and the die pad terminal 43 are adhered to each other by the Ag paste 46. The die pad terminal has a structure wherein the Cu core 41 is plated with Pd/Au 42, and its peripheral planes are manufactured by counter boring in order to produce an anchor effect relative to the molding resin. The lead terminals protrude out from both sides of the resin body 47.

In accordance with the present embodiment, the same advantages as the embodiment indicated In FIG. 1 can be obtained. Because the peripheral planes of the die pad terminal are manufactured to have a shape which enables the die pad to be engaged with the resin, the die pad terminal can be pressed to the rear plane of the chip by the shrinking force of the molding resin. Therefore, even if the chip/die pad connecting method using Ag paste, which makes for easy assembling, is adopted, a reliable semiconductor package can be provided.

Figure 4A:
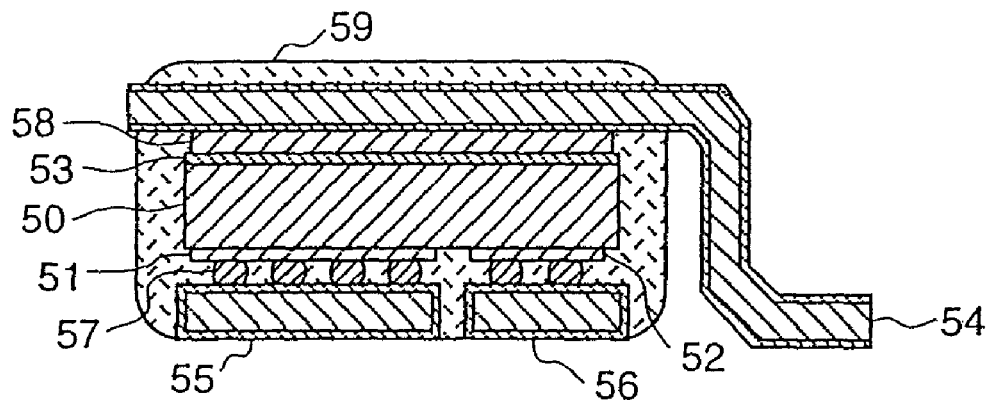
FIG. 4(a) is a cross-sectional view and FIG. 4(b) is a bottom plan view of another embodiment of the semiconductor package of the present invention.
Figure 4B:
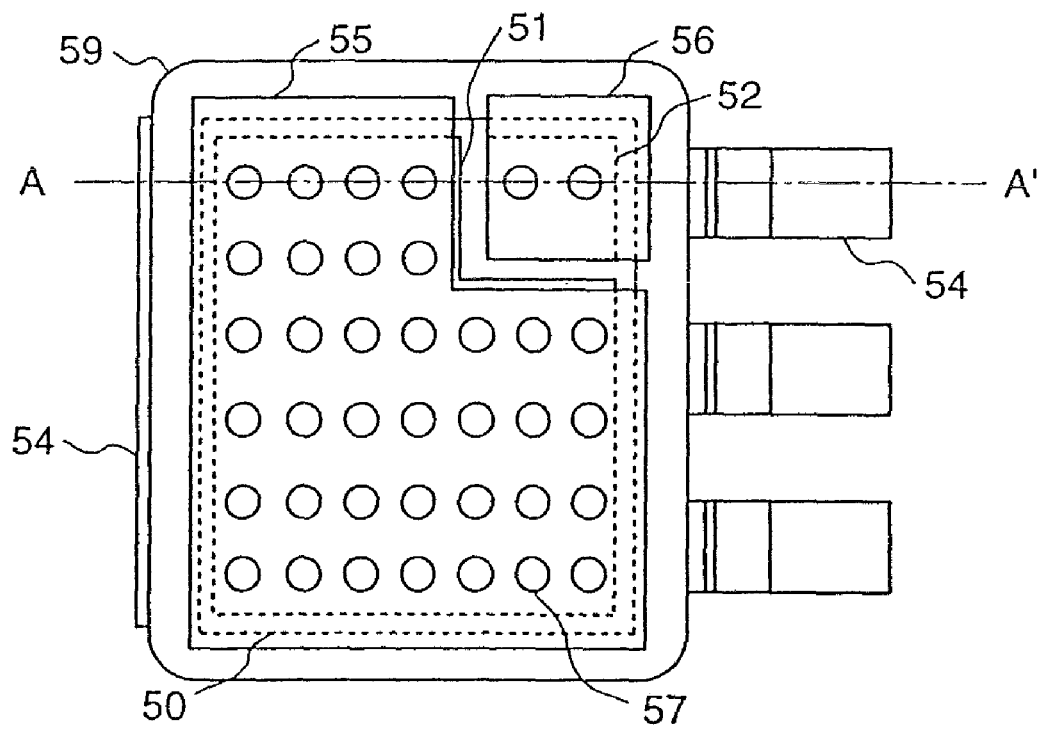

FIGS. 4(a) and 4(b) are directed to an embodiment of the semiconductor package of the present invention, wherein the package structure enables the mounting of the circuit forming plane toward the wiring substrate. As shown in the drawing, plural Au bumps 57 are formed on the Al electrodes 51, 52 for main current and for control on the circuit forming plane of the semiconductor chip 50, respectively, as in the embodiment indicated in FIG. 1; and the external connection terminal for main current 55 and the external connection terminal for control 56, which have a size equivalent to the size of each electrode and are containable in the resin body 59, are bonded thereon by a thermosonic thermocompression bonding method. The surface of each external connection terminal is plated by Pd/Au flush plating. The rear plane electrode 53, the outermost surface of which is composed of a Au or Ag vapor deposition film, is formed at the rear plane of the chip, and the external connection terminal 54 for rear electrode, Cu surface of which is plated by Pd/Au flush plating, is bonded thereon by thermosonic thermocompression bonding method interposing an Ag mesh sheet 58 plated with Sn of 0.1-5 μm in thickness between them. The external connection terminals for main current and for control are molded in a condition in which they are exposed to the surface of the resin body, and the external connection terminals for the rear plane electrode protrude out from both left and right sides of the resin body. The one side of the external connection terminals for the rear plane electrode is cut off, and the other side is manufactured to be folded.

In accordance with the present embodiment, the same advantages as the embodiment indicated in FIG. 1 are achieved. Furthermore, cooling of the package can be performed most effectively and the temperature rise at the Al electrode portion can be suppressed to a small amount, because its structure enables the circuit forming plane of the chip, i.e. a heater of the chip, to release heat effectively to the wiring substrate. As a result, the product life under conditions of practical use can be improved significantly, because the thermal strain generated between the external connection terminals and the chip can be made small, and growing compounds between the Al electrode film and the Au balls can be suppressed.

Figure 5:
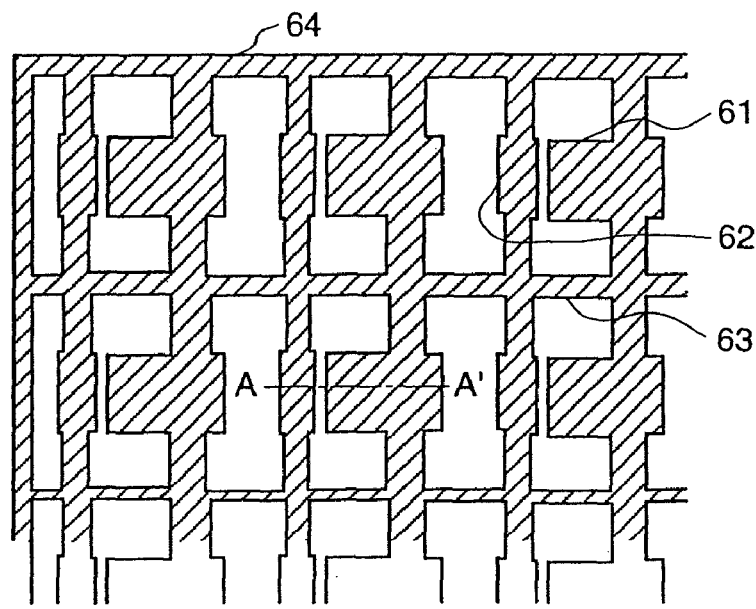
FIG. 5 is a diagram of an example of the lead frame used for the semiconductor device of the present invention.
Figure 6:
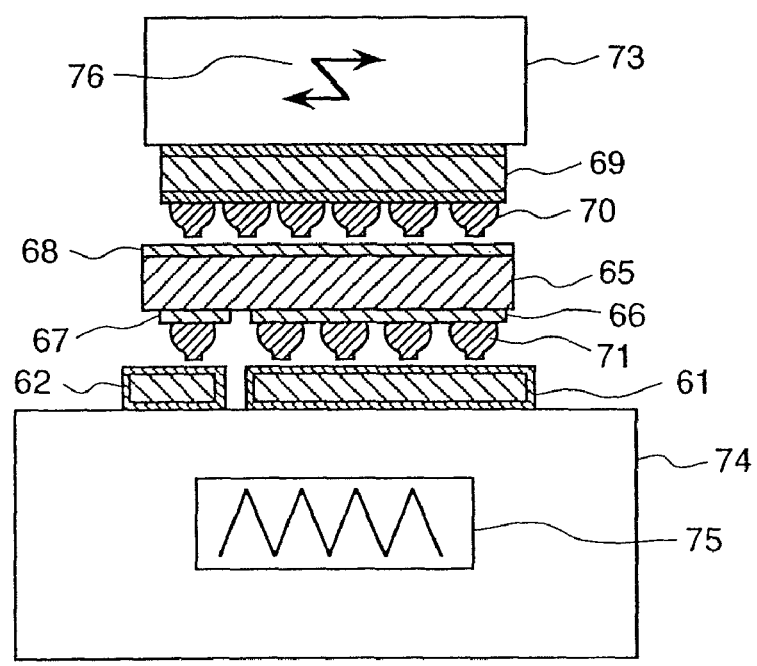
FIG. 6 is a diagram showing the assembled structure and assembling method of the semiconductor package of the present invention.
Figure 7:
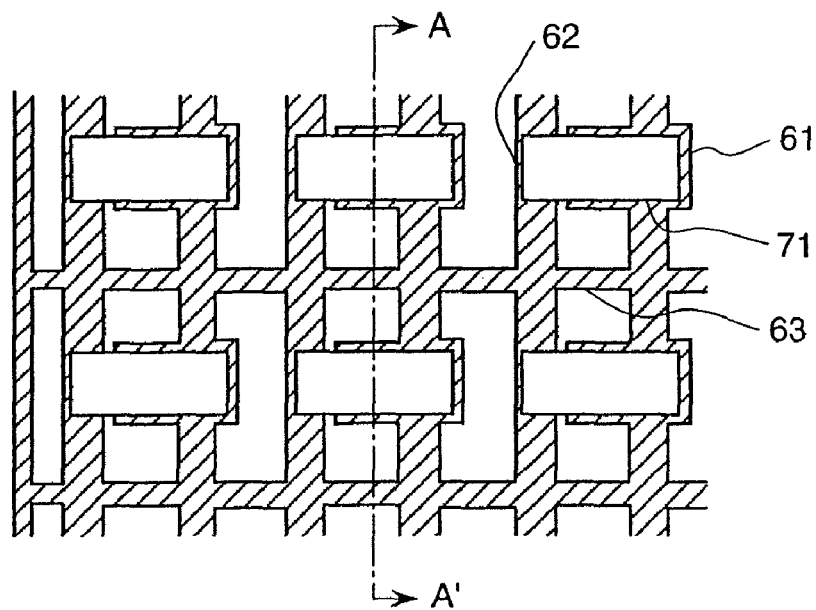
FIG. 7 is a diagram of the lead frame structure during assembling of the semiconductor package of the present invention.
Figure 8:
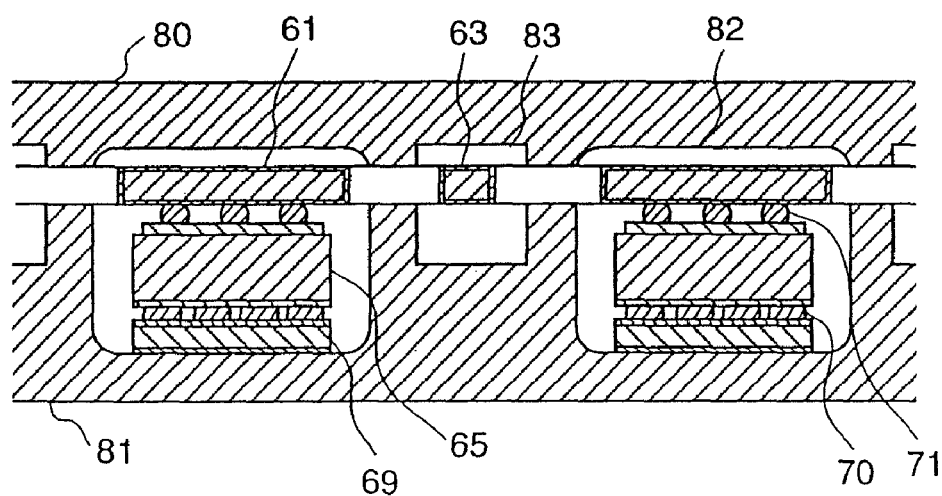
FIG. 8 is a diagram illustrating the resin molding method for the semiconductor package of the present invention.

FIG. 5 indicates an embodiment of a matrix lead frame for the source and gate electrodes used for assembling the semiconductor package of the present invention; FIG. 6 illustrates the bonding method during assembling of the package as seen from the cross section A-A' in FIG. 5; FIG. 7 shows the appearance of the matrix lead frame after bonding; and FIG. 8 is an illustration representing the resin molding method. In accordance with FIG. 5, a unit, wherein the lead for source 61 and the lead for gate 62 make up a pair to form the unit, is arranged in a X-Y direction. The reference numeral 63 in FIG. 5 indicates an inner lead frame, and the reference numeral 64 indicates an outer lead frame. In accordance with FIG. 6, the Au bumps 71 formed previously on the Al electrodes 66, 67 of the semiconductor chip are positioned and mounted onto the leads for the source 61 and for the gate 62 of the matrix lead frame. The reference numeral 75 in FIG. 6 indicates a heater. The die pad terminals 69 for the drain, whereon the Ag bumps 70 are formed previously, are mounted onto the chip rear plane electrode 68. The bonding portions at the upper surface and the lower surface of the chip are bonded simultaneously by heating the heating stage 74 for mounting the matrix lead frame at 200° C., and compressing the die pad terminals using the bonding tool 73, which produces ultrasonic vibration 76, with a force of 50-500 g per bump. In accordance with the ultrasonic vibration, the bonding operation is performed while controlling the flattened amount of the bumps, and the preciseness of the height of the lead and the die pad is controlled to be within a designated range. The direction of the ultrasonic vibration is restricted to the longitudinal direction (up and down direction in FIG. 5), where the rigidity of the lead is high, in order to prevent the bonding portion from generating bonding failure by resonance of the lead. The die pad terminal is manufactured by punching it out from a large Cu plate which is plated previously with precious metal, because the die pad terminal is separated and assembled individually. The state wherein the matrix lead frame (FIG. 7) after completion of the bonding is set in a metal mold is indicated in FIG. 8. FIG. 8 indicates a cross sectional structure as seen from the direction perpendicular to the A-A' cross section in FIG. 7. In accordance with FIG. 8, the cavities 82 of the metal molds 80, 81 are formed to match the arrangement of the matrix lead frame and are arranged in the X-Y direction. Escaping spaces 83 for containing lead hangers are provided. The matrix lead frame is set into the cavity of the lower die 81 by positioning the semiconductor chip 65 so as to be contained therein, and then, the upper die is placed thereon and compressed. The height of the source and gate leads extending out from the cavity is adjusted to be equal to or somewhat higher than the depth of the cavity in the lower die, and its structure is composed so that, when the leads are held by the side walls of the upper and lower cavities, the die pad terminal is compressed toward the bottom of the cavity. The leads are pressed down at left and right sides as the chip portion is in the center. However, if the amount of the pressing down is too large, the leads may be subjected to the bending deformation, and a tensile stress is generated at the Au bump portion of the middle of the chip. Therefore, in order to make the bending deformation of the leads in a convex shape at the middle of the chip as small as possible, the lead holding portion of the upper die is manufactured in the shape of knife, and the lower die is made to have a step, inner side of which is lower than the outer side, so as to deform the leads in a W-shape. Regarding the molding resin, the size of the silica particles for lowering the thermal expansion is decreased so as to improve the efficiency of filling of the resin into the gap of 10-20 μm between the bump bonding portion, in order to prevent generation of resin voids during the pressure-injecting process.

In accordance with the lead frame and its manufacturing method, low cost semiconductor packages can be provided with the following effects. The IC units are arranged in a matrix state in the lead frame for assembly, and the productivity can be increased by increasing the number of packages taken from a lead frame; the die can be manufactured without increasing its cost, because the matching planes of the dies, except for the lead holding portions, can be manufactured precisely by surface grinding manufacturing; decreasing the number of manufacturing steps is possible, because the die pad-chip connection and the circuit forming plane side connection can be performed simultaneously by one bonding step. Additionally, as a structural feature, a small and thin semiconductor package close to the size of the chip can be provided.

Figure 9:
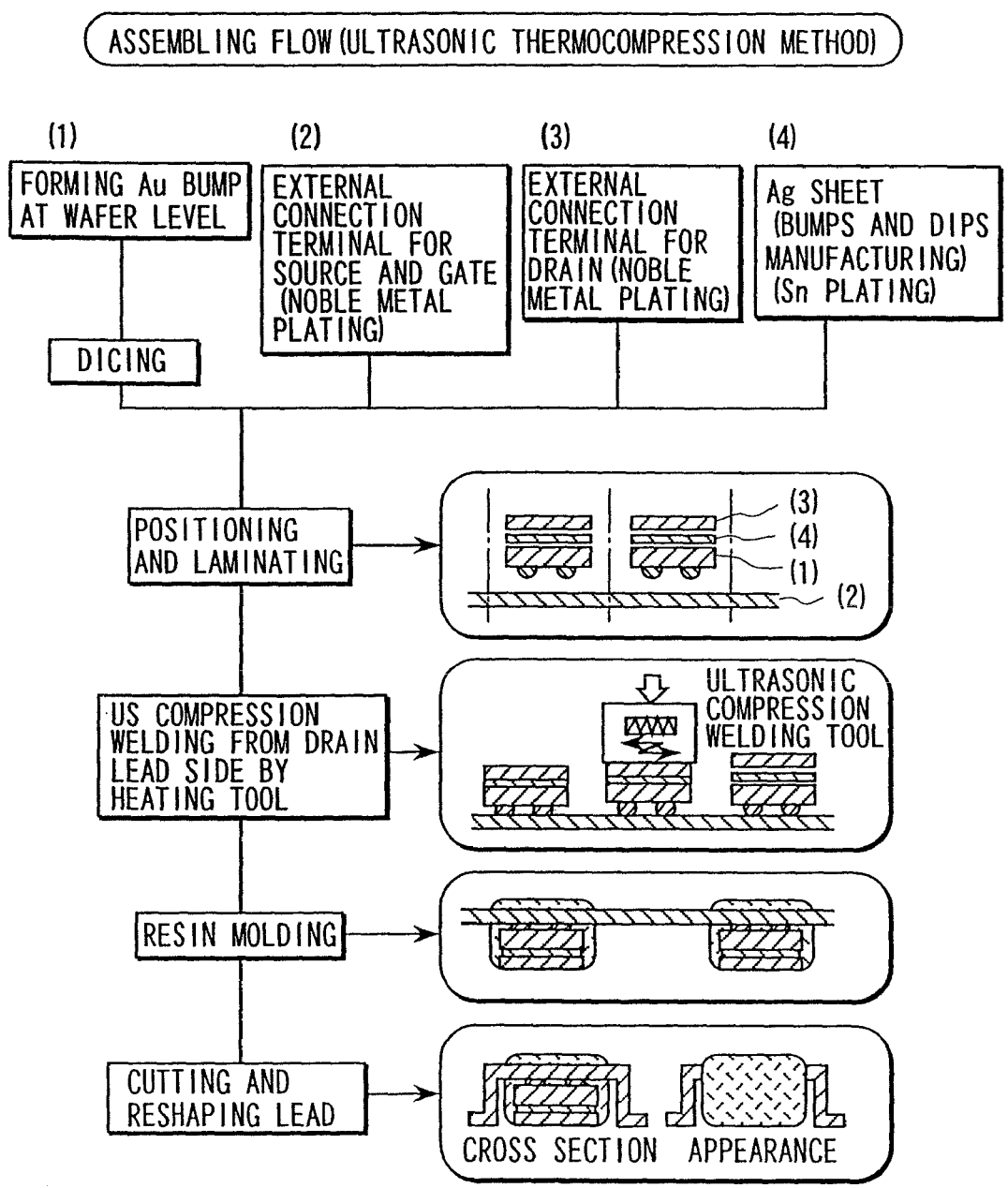
FIG. 9 is a flow diagram of the assembling of the semiconductor package of the present invention.

FIG. 9 indicates an embodiment relating to the steps for assembling the semiconductor package of the present invention. In accordance with FIG. 9, four components are used in assembling the semiconductor package. The semiconductor chip is provided with Au bumps, which are formed at wafer level, and cut pieces by dicing. Formation of the Au bumps can be performed by any one of various known methods, such as a ball bonding method, a plating method, and an Au ball transcription method. The reference character (4) in FIG. 9 indicates a Ag sheet. The external connection terminals for the source and gate are manufactured and reshaped by a punching method or an etching method from a Cu alloy plate in a matrix lead frame shape, and after plating Ni onto the surface of the terminal as a base, Pd is plated to approximately 0.02-1 μm thereon. Finally, the terminals are finished by plating its outermost surface with Au to approximately 0.001-1 μm thick. The external connection terminals for the drain is manufactured by plating the surface of a Cu tape with Ni as a base, Pd is plated to approximately 0.02-1 μm thick thereon, the outermost surface of the terminals is plated with Au to approximately 0.001-1 μm thick, and finally, the Cu tape is cut into pieces of plates having an equivalent size to the chip, The Ag sheet for the chip-die pad connection is manufactured by forming the bumps and dips on one side or both sides of a Ag tape of 10-100 µm thick by pressing, and plating Sn of approximately 0.1-5 µm thick thereon. The thickness of the Sn at this time is determined so that the weight ratio of Sn to Ag becomes equal to or less than 20% by weight. Finally, the Ag sheet is cut to pieces of plates having an equivalent size to the external connection terminal for the drain or the chip. Each of the components are bonded simultaneously per one IC as a unit, after mounting the matrix lead frame onto the bonding stage, laminating in the order of the semiconductor chip, the Ag sheet, and the external connection terminals after positioning each relative to the other, and heating, pressing, and ultrasonic vibrating simultaneously. After finishing the bonding of all the matrix, the resin molding step is performed by the same procedure as the embodiment indicated in FIG. 8. Finally, the semiconductor packages connected in a matrix state are cut and separated into pieces, and the semiconductor package is completed by manufacturing the lead to fold and reshape.

In accordance with the present embodiment, manufacturing steps for the components can be performed in parallel lines, and an incorporated production of a large number of packages is possible; and in the assembling line only three steps are employed, including (1) setting the components and bonding, (2) resin molding, and (3) cutting and reshaping the lead, with the result that one step can be omitted in comparison with the conventional chip-die pad connection and wiring bonding process. Furthermore, the total production time can be decreased, and significant improvement in the productivity can be realized, because the above step (1) assembly can be performed with less time than the time for wire bonding.

FIGS. 10(a) to 10(c) are directed to indicates an embodiment of a bonding structure of the chip rear plane electrode of the present invention. The lead frame is assembled with two lead frames, such as the lead frame for the source and gate, and the lead frame for the drain. The reference numerals 94 and 96 in FIG. 10 indicate an outer lead frame, respectively. As seen in the drawing, the lead frame made of Cu alloy forming the lead for source 91 and the lead for gate 92, and the lead frame forming the die pad for drain 95 are plated with Pd/Au all over the surface thereof. The Au ball bumps 101 are formed on the die pad for the drain by the ball bonding method. In accordance with this structure, the semiconductor chip 97 having a rear plane electrode 102, wherein the Au ball bumps 100 are formed previously on the Al electrode 98, is interposed between the above two kinds of lead frames, and the upper portion and the lower portion of the chip can be bonded simultaneously. FIGS. 11(a) and 11(b) are directed to an example of the semiconductor structure, which is obtained by molding the above bonded body with resin, and reshaping the lead. As seen in the drawing, the source lead 91 and the gate lead 92 protrude out from one side wall of the resin body 103, the lead for drain protrude out from the other opposite side wall, and each of the leads is manufactured by a folding process. The neck portion 93, which comprises a locally slender portion, is provided to the leads in the resin body, in order to provide a structure, wherein the stress generated at the folding process is hardly transmitted to the bonding portion of the bumps. The height of the protruded position of the leads at the left side differs from that at the right side. Accordingly, the matching planes of the upper metal mold and the lower metal mold are manufactured with a single step. The rear plane of the chip has a compression bonded structure consisting of Au deposition film/Ag bumps 101/Pd/Au plated die pad, and the upper surface of the chip has a compressed structure consisting of Al electrodes 98, 99/Au bumps 100/Pd/Au plated leads 91, 92. The reference numeral 104 in FIG. 11 indicates lead for a drain.

In accordance with the present embodiment, a semiconductor package containing no Pb, which is desirable in view of environmental problem can be provided. Additionally, the heat resistance of the package is high because the chip-die pad structure is composed by direct bonding of precious metals via the Ag bumps; and temperature cycle reliability of the package is high because THE thermal strain between the chip/die pad can be relaxed by the Ag bumps. The lead has a desirable wettability with solder. As A result, the assembling process of the package can be shortened and productivity is increased, because the solder plating after assembling the package becomes unnecessary. Additionally, an advantage is realized in that a small and thin semiconductor package can be provided, because the chip can be molded with resin with a size close to the chip size.

FIGS. 12(a) and 12(b) are directed to an embodiment of a bonding sheet for bonding the chip and the die pad. As seen in the drawing, the sheet 110 is made of pure silver plate of 20 µm thick, and the grooves 111 of 10 µm deep are formed on one side of the sheet. The grooves are formed by press manufacturing or half cut manufacturing with a dicing plate. The Ag sheet is annealed after roll manufacturing and groove manufacturing so that the hardness of the Ag sheet becomes equal to or less than 35 Hv.

By using the Ag sheet of the present embodiment for performing the thermosonic thermocompression bonding of the chip/die pad, the composition deformation of the Ag sheet is facilitated by the presence of the grooves and softness of the material, and tight and high heat resistant bonding can be achieved without damaging the chip, because newly generated planes are formed and the bonding process is performed readily at the boundary of the bonding planes under the condition that the stress added to the Si chip is small. And, a semi-conductor package having high temperature cycle reliability can be provided, because the thermal strain between the chip/die pad accompanied with heat generation of the chip during use of the package can be absorbed by the soft Ag sheet having the groove space.

FIG. 13 shows one of the other embodiments of the bonding sheet for bonding the chip and the die pad. In accordance with FIG. 13, the core portion 112 of the bonding sheet is an Ag sheet manufactured in the same way as the Ag sheet indicated with reference to FIGS. 12(a) and 12(b). The surface of the Ag sheet is plated with Sn 113 to 0.3-2.0 µm thick.

By using the bonding sheet of the present embodiment for performing the thermosonic thermocompression bonding of chip/die pad, a liquid phase is formed at a temperature above 220° C. by a Ag—Sn reaction, and the surface of the sheet is covered with a thin film of the liquid. Therefore, an advantage is realized in that ensured and tight bonding can be achieved readily under a low compression condition, because the liquid in the region where the sheet is compressed to the die pad or chip rear plane electrode is ejected outside and the bonding between the members having a high melting point is readily performed. Furthermore, because Ag is supplied by dissolving or diffusion during heating from the core to the Ag—Sn layer ejected from the bonding interfaces, the melting point of the Ag—Sn layer is elevated finally to higher than 470° C., and the bonding portion can have a high heat resistance. Regarding the reliability of the semiconductor package, the same advantages as the embodiment indicated in FIG. 1 can be obtained.

FIGS. 14(a) and 14(b) show one of the other embodiments of the bonding sheet for bonding the chip and the die pad. As seen in the drawing, the bonding sheet is a mesh shaped sheet composed of Ag wires 114, 115 woven in vertical and horizontal directions.

In accordance with the present embodiment, the bonding sheet has bumps and dips, where the thickness at the portion where the Ag wires are overlapped is thick and the thickness at the other portion is thin. Therefore, the composition deformation at the thick portion can proceed readily, and the same advantages as the embodiment indicated with reference to FIGS. 12(a) and 12(b) can be obtained.

Figure 15:
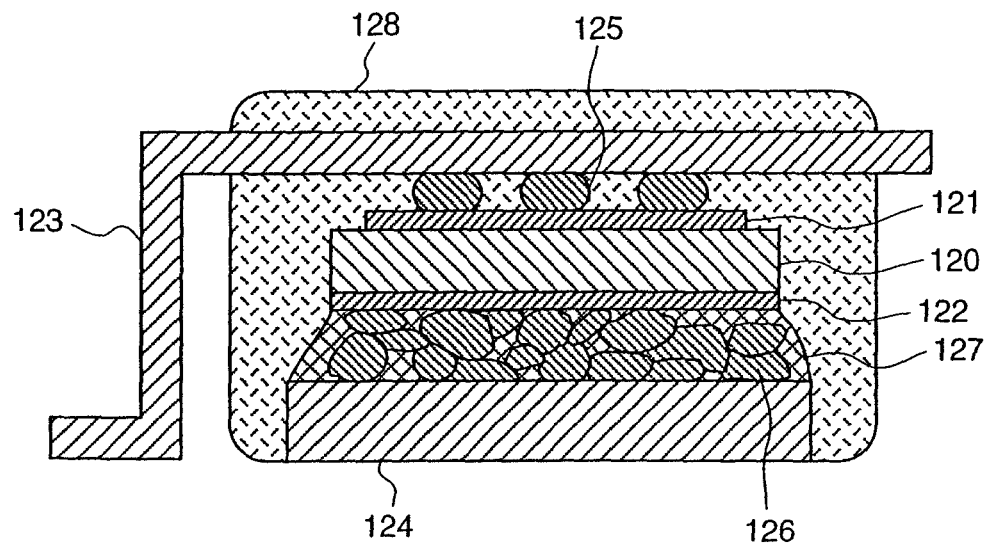
FIG. 15 is a cross-sectional of another embodiment of the semiconductor package of the present invention.

FIG. 15 indicates an embodiment of the semiconductor package of the present invention, wherein Ag particles are used for bonding the chip and the die pad. In accordance with FIG. 15, the Al electrode 121 is formed on the circuit forming plane of the semiconductor chip 120, and plural Ag bumps 125 are formed thereon. On the rear plane of the chip, the rear plane electrode 122, the outermost surface of which is plated with Ag, is formed. The lead 123, which is plated with precious metal, on the circuit forming plane and the Ag bumps are directly bonded by thermosonic thermocompression bonding. The chip rear plane electrode 122 and the die pad terminal 124, which is plated with precious metal, are bonded by thermosonic thermocompression bonding with the Ag particles 126 interposed therebetween, which particles are composed by mixing Ag with the resin 127 in a ratio of more than 90% by volume Ag. The amount of the resin is determined to be so small that the resin pushed out during the compression does not flow down from the side plane of the die pad terminal onto the compression stage, but in a sufficient amount that the mixture can be treated as a viscous liquid. The resin is a thermosetting resin, and the resin is cured by heating at the time of bonding. The Ag particles and the Ag deposition film at the rear plane of the chip, the Ag particles and the die pad terminal, and the Ag particles themselves are bonded partly by metal bonding in the region of the contacting portions. The size of the die pad terminal is as large as is capable of being contained into the resin body 128, and is the same as the size of the chip. It may be somewhat larger or smaller than the chip.

In accordance with the present embodiment, a small and thin semiconductor package having a low electrical resistance, and containing no Pb can be provided. Because the Ag particles are mixed with resin, dispersion of the Ag particles can be prevented by the viscous property of the resin, and the productivity can be improved by the ease of the Ag particle supply to the bonding portion. Because narrow gaps between the Ag particles after bonding can be filled with the mixed resin, the necessity to fill the gaps with the molding resin can be eliminated, an advantage is realized in that the generation of voids can be decreased significantly and the production yield can be increased. Furthermore, although the bonding agent is a mixture of the resin and Ag particles, the thermocompressing bonding method using concurrently ultrasonic vibration is used for the bonding. Therefore, the resin is pushed out from the bonding interface of the metals and a tight bonding of metals each other is achieved at the bonding portion. Accordingly, an advantage is achieved in that the bonding reliability is remarkably improved in comparison with the adhesion obtained with the use of Ag paste.

Figure 16:
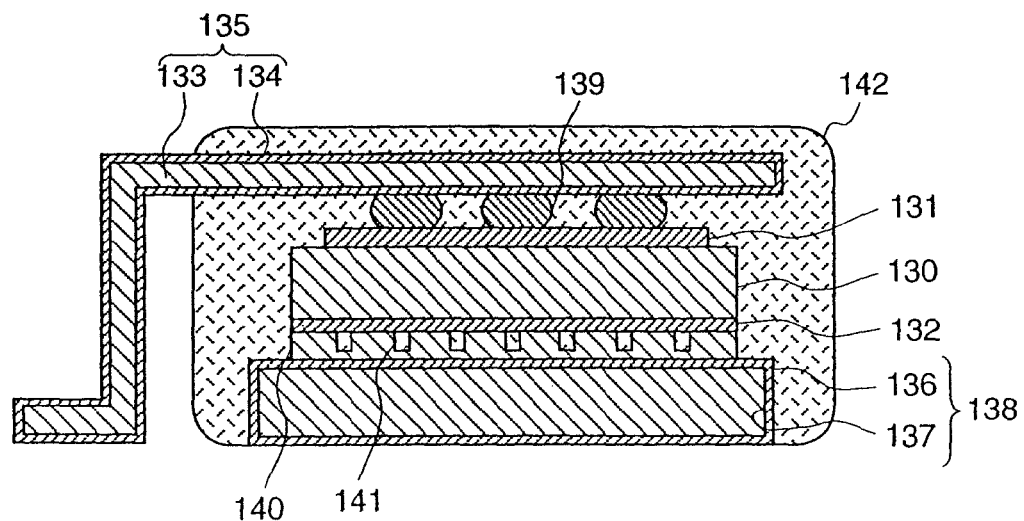
FIG. 16 is a cross-sectional view of another embodiment of the semiconductor package of the present invention.

FIG. 16 indicates an embodiment of the semiconductor package of the present invention, wherein a Ag sheet having grooves is used for bonding the chip and the die pad. In accordance with FIG. 16, the Au balls 139 are formed on the Al electrode 131 of the chip 130, and an Ag deposition film is formed on the outermost surface of the rear plane electrode 132. The surfaces of the lead terminal 135 and the die pad terminal 138 are plated with Pd. The Ag sheet 140, whereon the grooves 141 are formed, is inserted between the rear plane of the chip and the die pad terminal. Each of the bonding portions is directly bonded by a thermo-compression bonding method concurrently using ultrasonic vibration. The lead terminals protrude from a side plane of the resin body and are manufactured to be folded. The reference numerals 133 and 137 in FIG. 16 indicate a Cu core, the reference numerals 134 and 136 indicate a plate with Pd, and the reference number 142 indicates a resin body.

In accordance with the present embodiment, in addition to the advantages provided by the embodiment indicated in FIG. 2, breakage of the respective bonding portions of the Al electrode/Au ball/lead terminal by thermal strain and the like can be decreased, and the reliability of the semiconductor package can be improved, because the resin bonding area at the upper and lower regions of the lead terminals can be made as wide as the amount of the lead terminals protrude from only one side, and a compression force between the lead/chip due to the force of the curing shrinkage of the resin can be increased.

Figure 17:
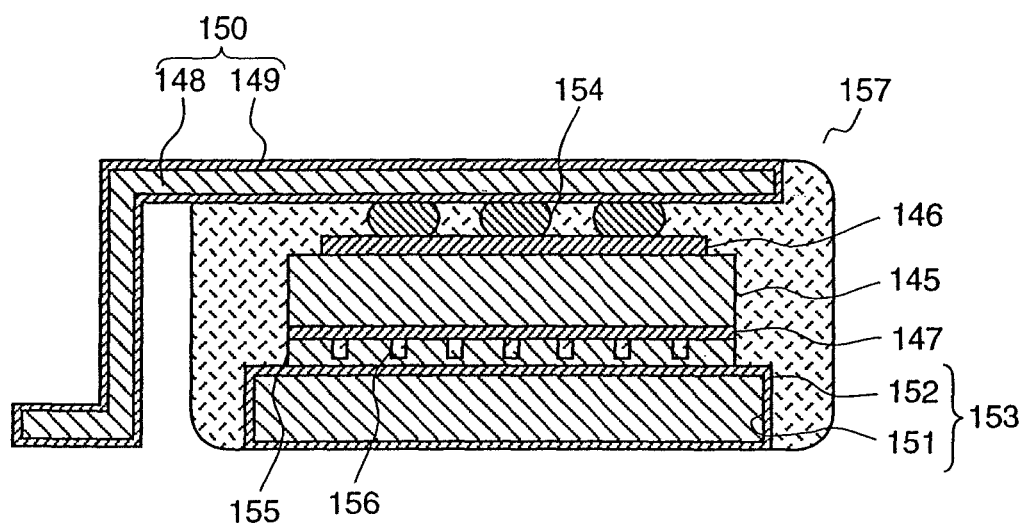
FIG. 17 is a cross-sectional view of another embodiment of the semiconductor package of the present invention.

FIG. 17 indicates an embodiment of the semiconductor package of the present invention, wherein a part of the lead terminal is exposed at the upper plane of the resin body. In accordance with FIG. 17, the Au balls 154 are formed on the Al electrode 146 of the chip 145, and an Ag deposition film is formed on the outermost surface of the rear plane electrode 147. The surfaces of the lead terminal 150 and the die pad terminal 153 are plated with Pt/Au 149, 152. The Ag sheet 155, whereon the grooves 156 are formed, is inserted between the rear plane of the chip and the die pad terminal. Each of the bonding portions is directly bonded by thermo-compression bonding while concurrently using ultrasonic vibration. The lead terminals protrude from a side plane of the resin body and are manufactured to be folded, and the lead terminal is exposed at the upper surface of the resin body. The reference numerals 148 and 151 in FIG. 17 indicate a Cu core, and the reference numeral 157 indicates a resin body.

In accordance with the present embodiment, in addition to the advantages provided by the embodiment indicated in FIG. 2, the heat resistance of the semiconductor package can be decreased significantly, because the heat can be released effectively from the wide area of the lead terminal exposed at the upper surface of the resin body.

Figure 18:
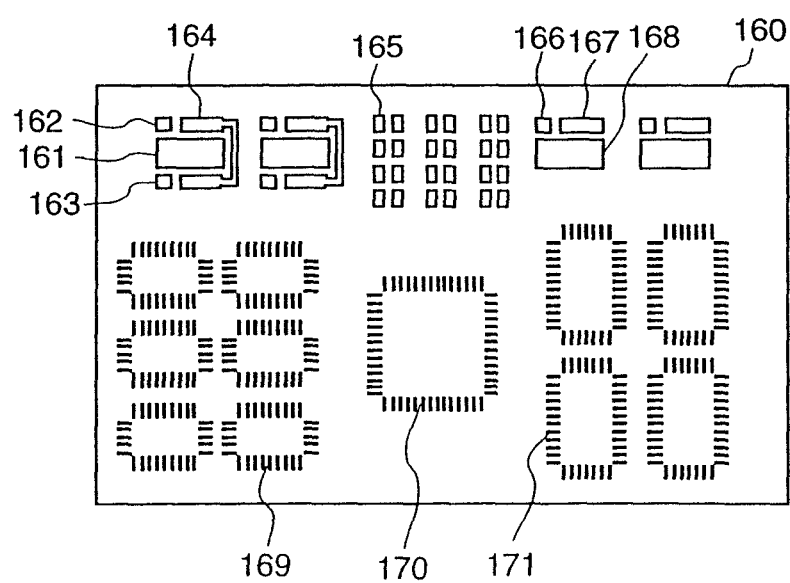
FIG. 18 is a top plan view of an embodiment of the wiring substrate mounting the semiconductor package of the present invention.
Figure 19:
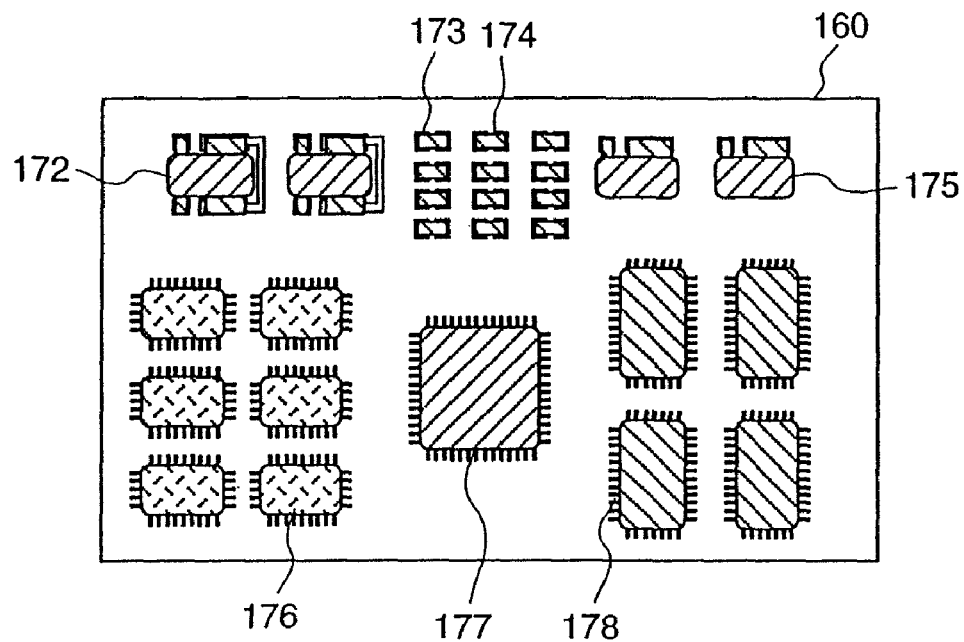
FIG. 19 is a top plan view of an embodiment of the electronic device mounting the semiconductor package of the present invention.

FIG. 18 indicates an embodiment of the wiring substrate for mounting the semiconductor package of the present invention. In accordance with FIG. 18, the wiring substrate 160 is a multi-layered organic substrate composed by laminating substrates, which are composed by forming a Cu foil pattern on an epoxy-glass cloth composite. Various semiconductor packages and connection terminals 165, 169, 170, 171 of passive devices are formed on the surface of the substrate. The connection terminals for mounting the semiconductor of the present invention are composed of the connection terminals 161, 168 for the drain, the connection terminals 164, 167 for the source, and the connection terminals 162, 163, 166 for the gate, all of which are in a size that is containable in the body of the package. FIG. 19 indicates an embodiment of an electronic device, wherein the wiring substrate indicated in FIG. 18 is mounted with the semiconductor packages of the present invention, LST packages, and elements. In accordance With FIG. 19, the LSI packages 176, 177, 178 for signal processing, the vertical semiconductor packages 172, 175, and the resistance and passive device of capacitance 173, 174 are mounted on the wiring substrate by soldering connection. The reference numeral 184b in FIG. 209 indicates an external connection terminal for drain.

In accordance with the present embodiment, the connecting area between the power semiconductor package and the substrate can be wide, and the chip, i.e. a heater, and the substrate can be connected with the shortest distance. Therefore, the temperature difference between the substrate and the package can be decreased, the stress generated at the solder connecting portions can be decreased, and a highly reliable electronic device can be provided. Because heat generation of the package is decreased, the temperature of the device is not elevated beyond the normal operating temperature range, even though no special heat releasing device is provided. Accordingly, such advantages are realized that the structure of the electronic device can be simplified, cost is suppressed, and the life of the electronic device can be improved due to the low temperature rise during operation.

As explained in detail above, in accordance with the present invention, the electrical resistance of the package can be decreased.

Figure 29A:
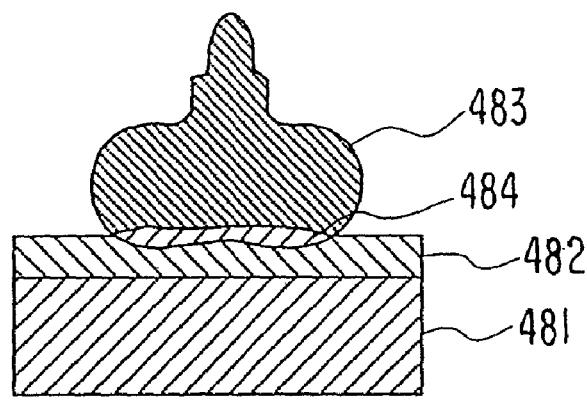
FIG. 29(a) is a cross-sectional view of a bonded structure and FIG. 29(b) is a graph indicating experimental data on the relationship between the strength of an Au/Al bonding portion versus the holding time at a high temperature for the bonded structure.
Figure 29B:
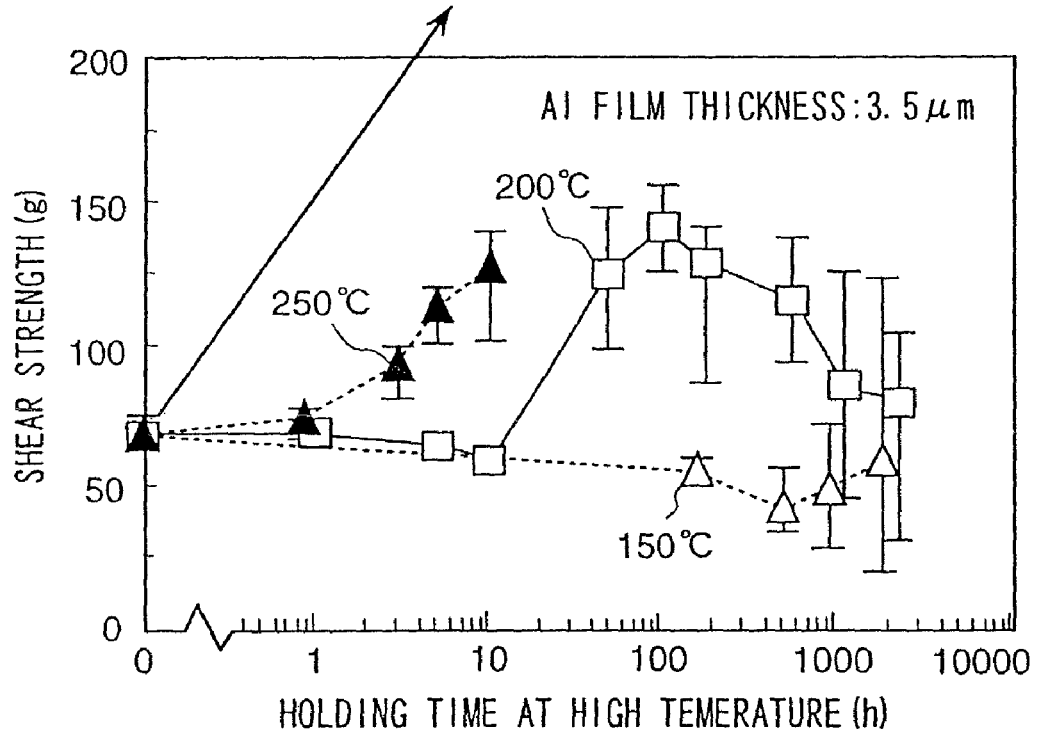
Figure 30A:
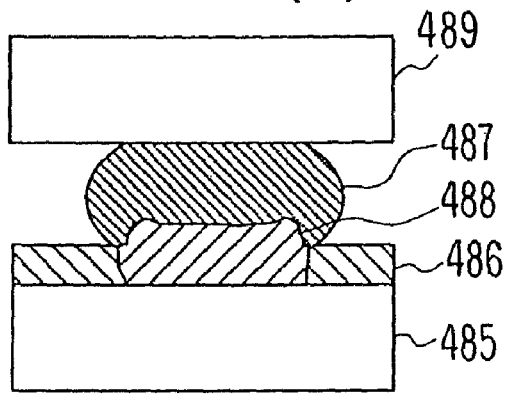
FIG. 30(a) is a cross-sectional view of a bonded structure according to this invention.
Figure 30B:
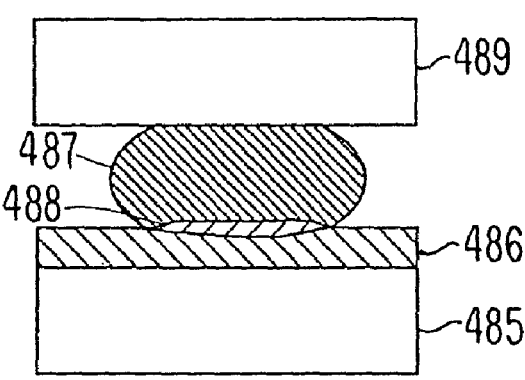
FIG. 30(b) is a cross-sectional view of a bonded structure of the prior art.
Figure 30C:
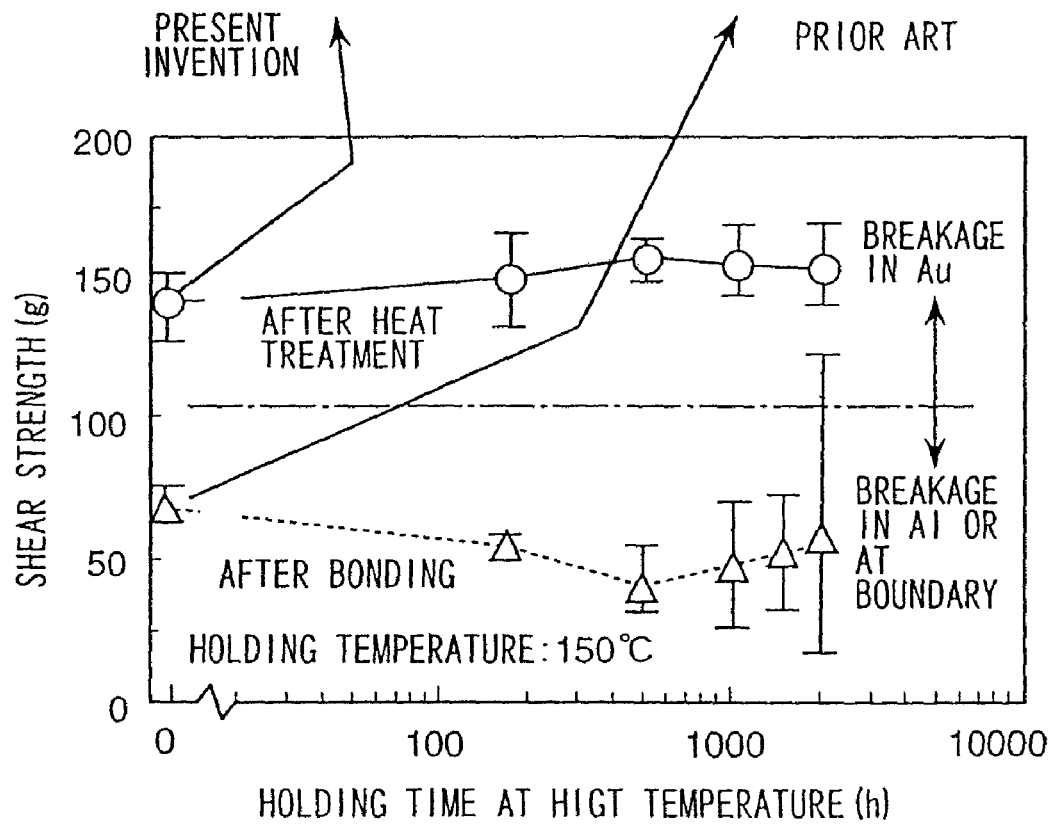
FIG. 30(c) is a graph indicating an experimental data on the relationship between the strength of Au/Al bonding portion versus the holding time at a high temperature.

FIG. 29 indicates changes of strength at the bonding portions, when Au ball bonding is performed on the Al electrode film of 3.5 μm thick at 200° C. of bonding temperature, and the bonding portions are held at a high temperature. When the holding temperature is lower than 200° C., a decrease of the strength can be observed in a short time, but the higher the holding temperature is, the sooner the strength is increased again. As the holding time is further extended, the strength is decreased again. As the result of analyzing the reason for the above phenomenon in detail, it was revealed that the strength immediately after the bonding depends on the strength of the Al film itself; and, the first decrease of the strength at the initial stage of holding at the high temperature is caused by growth of an $AuAl_2$ compound, which is known conventionally and called a purple plague, at the boundary of a AuAl alloy layer and the Al film. Furthermore, it was revealed that the increase in strength is caused by changing all the Al film at the bonding portion to the AuAl alloy layer, which is stronger than Al, and the subsequent decrease in the strength is caused by growing defects known as carkendahl voids at the boundary plane of the Au/AuAl alloy layer. It was found that the increase in the strength as much as twice the bonding strength is caused by the presence of fine bumps and dips on the surface of the transistor chip corresponding to structure having a large number of cells, and the alloy layer and the Si substrate forms a mechanical meshing structure. This is a phenomenon which does not occur with conventional LSI devices. It was found that, after performing a heat treatment for a short time at a high temperature higher than 250° C., growth of the carkendahl voids did not become any problem at a heating temperature of 150° C. and a holding time of 2000 hours, and the decrease in the strength was not generated, as indicated in FIG. 30. The inventor of the present invention utilizes the above phenomenon and has achieved an improvement of the initial bonding strength by as much as approximately twice, and the improvement of the reliability for connection at the metallic bonding portions themselves during the temperature cycle in the region lower than 150° C., i.e. the temperature for practical use, and holding at a high temperature. Furthermore, with regard to the bonding the lead for an electrode with the Au bumps on the chip, an thermosonic thermocompression bonding method, which is performed under a low temperature (lower than 250° C.) and a low load without damaging the chip, has been developed, which makes it possible to bond at a low temperature. Accordingly, in view from the above, thermal strain generated during the cooling step in the bonding operation could be decreased significantly, and the reliability of the connection at the metal bonding portions could be improved. Simultaneously, in accordance with realization of the low temperature bonding method, it becomes possible to perform metallic bonding and resin adhesion simultaneously by filling the resin into the gap between the electrode lead/chip when bonding the electrode lead/chip. Then, because the resin is pushed out by compression, resin can be filled with no void, and because the bonding can be achieved in a condition wherein a compression force is added to the Au bumps by a curing shrinking phenomenon of the resin, the fatigue life can be extended by the effect of the compression stress, even if a temperature cycle is added.

Next, a high reliability package, which does not contain Pb and has no resin sealing, will be explained hereinafter. The transistor package is composed of a structure, wherein three independent metallic components are connected electrically with respective electrodes of the chip and fixed in the structure. Conventionally, the fixing of the respective metallic components has been performed with use of a cured resin. However, in accordance with the structure of the present invention, the metallic components are fixed by bonding the respective component with the chip flexibly and tightly by concurrent use of metallic bonding and resin adhering. The reason to use the metallic bonding and the resin adhering concurrently is that, although a high strength can be achieved by use of only the metallic bonding, if the cu, which is a core material of the metallic component, is bonded with the Si chip tightly, a large strain is generated in the Si chip due to the difference of thermal expansion of the Cu and the Si chip, and deterioration of their characteristics, or in an extreme case, damage of the chip can be generated. Therefore, it is necessary to make the bonding portion have a flexible structure for absorbing the strain, and as the metallic bonding structure having spaces, the structure of the present invention, wherein insufficient bonding strength is reinforced by resin adhesion, is realized. In accordance with the structure of the present invention, if the resin is used in the form of a film, the resin adhering and the metallic bonding can be performed in the same bonding step, simultaneously, the mold-bake step of the resin can be omitted. Accordingly, the production cost can be decreased, the productivity can be improved, and the transistor package, which is desirable in view of environmental problems, can be provided. In accordance with performing the metallic bonding by a thermosonic thermocompression method, by treating the surface of the metal with spatter cleaning before bonding, and by changing the bonding force from low loading to high loading in a slope shape under adding the ultrasonic waves; metallic bonding having a high strength under the condition that the deformation of the bumps is small can be achieved.

Hereinafter, embodiments of the present invention will be explained in detail with reference to the drawings.

Figure 22A:
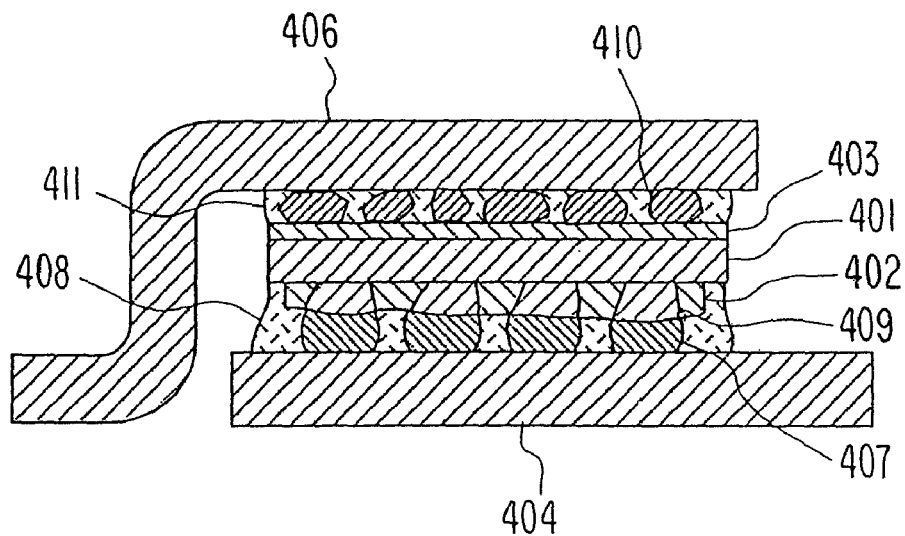
FIG. 22(a) is a cross-sectional view and FIG. 22(b) is a top plan view of an embodiment of the transistor package of the present invention.
Figure 22B:
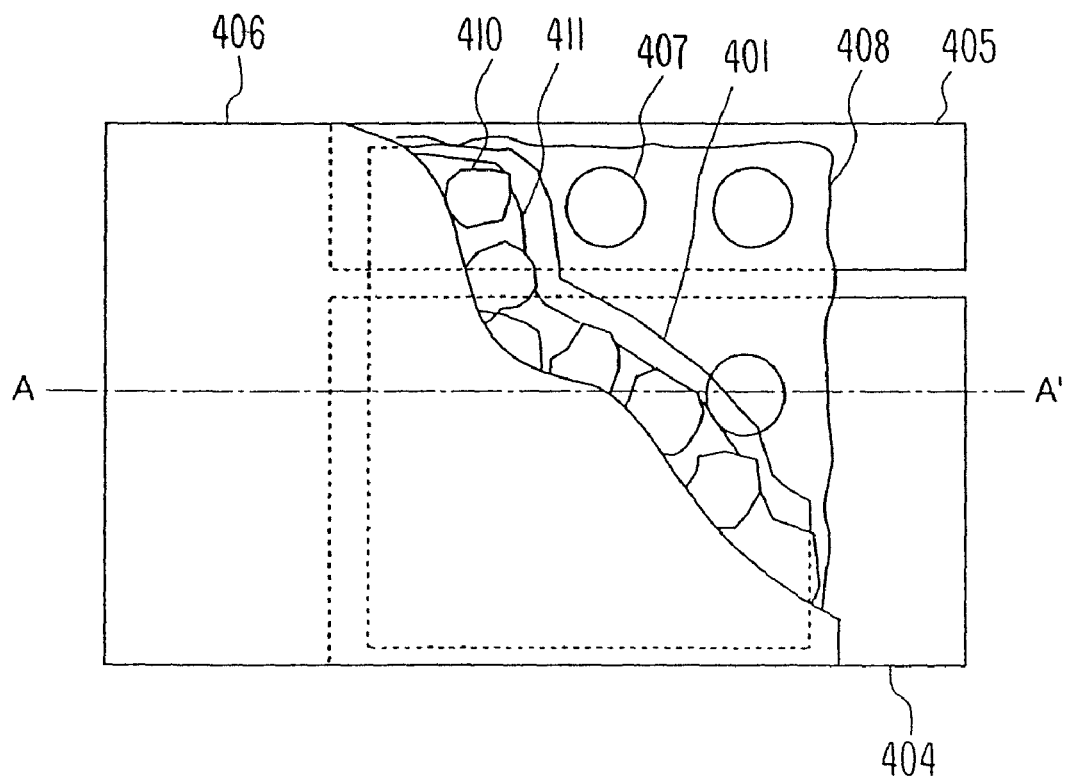

FIGS. 22(a) and 22(b) are directed to an embodiment of the transistor package relating to the present invention. In accordance with FIG. 22(a), the Al electrode 402 of 2 μm thick is formed on the circuit forming plane of the transistor chip 401, and the rear plane electrode 403, the outermost surface of which is plated with Au, is formed on the opposite plane of the transistor chip 401. The Au bumps 407 are formed on the Al electrode by a ball bonding method. In this step, all the Al electrode film under the bumps is changed to a AuAl alloy 409 by heat treatment of, for instance, 300° C.-2 hours, or 250° C.-10 hours. The surface of the metallic lead 404, 405 is plated with Pd/Au, and the metallic leads are bonded with the Au bumps formed on the Al electrode by an incorporated thermosonic thermocompression bonding method at a relatively low temperature, such as lower than 250° C. The first resin 408 is supplied in the form of sheet at the thermosonic thermocompression bonding, and is adhered and cured simultaneously with the bonding of the Au bumps. The height of the bumps (resin thickness) after bonding is several tens microns. The chip rear plane electrode and the die pad mounting lead 406 hold between them the second resin 411 sheet, wherein precious metal particles are buried, and the chip rear plane electrode and the die pad mounting lead 406 are bonded by compression with the addition of ultrasonic waves and heating at a relatively low temperature such as lower than 250° C. The precious metal particles, i.e. Ag particles 410 in this case, are deformed by compression from the rear electrode and the die pad, and a metallic bonded condition results. The die pad mounting leads are manufactured previously to be folded, and the bonding condition is controlled so that the lower plane after deforming and bonding of the Ag particles is approximately in a same plane as the plane of the electrode lead. The first and second resin adhere to the upper and the lower members, and give a compression stress to the bonding portion due to the shrinking phenomenon at the curing time. Here, a thermo-adhering polyimide resin is used as the first and second resin, but an epoxy resin, which can be cured at room temperature, or another resin may be used.

In accordance with the present embodiment, the strength at the bonding portions of the Al electrode/Au bump/electrode lead can be increased by making all of the Al under the bonding portions of the transistor package an alloy, while a decrease of the strength by holding the bonding portions at a high temperature is prevented, and a structure, wherein the compression force is applied to the bonding portions by the effect of the resin adhering, is composed. Accordingly, a highly reliable and low resistant transistor package having a significantly extended temperature cycle life can be provided. Because the bonding temperature in the compression bonding of the metals to each other is lowered to lower than 250° C., concurrent bonding with the resin adhering becomes possible, and filling and adhering the resin with no voids also becomes possible. Furthermore, the residual stress at the bonding portions can be decreased by lower temperature bonding. Accordingly, in view of the above points, the reliability of the transistor can be improved.

In accordance with the bonding structure, wherein the rear plane electrode of the chip and the die pad mounting leads are bonded by concurrent use of the metallic bonding and the resin adhering, of the present embodiment, and thermal and electrical conductivity at the bonding portions are ensured, and simultaneously, the difference in thermal expansion between the chip and the die pad mounting leads are absorbed by the deformation of the space filled with the resin. Furthermore, the temperature cycle life of the die pad-bonding portions can be improved by a compression load applying effect on the metallic bonding portion accompanied with the curing shrinkage of the resin, and the package containing no Pb, having concurrently desirable electrical and thermal conductivity, temperature cycle reliability, and solder reflow endurance can be provided.

Furthermore, for the above two reasons, the reliability of the package can be ensured without performing a resin sealing. Accordingly, a small size and low resistant transistor package, which can save resin, decrease the production cost and the production time by omitting the molding step, and is desirable in view of environmental problems, can be provided.

Because the bonding portions of the Al electrode and the Au bumps are changed to a Au—Al alloy for strengthening by heat treatment in the step to bond the chip with the electrode lead via Au bumps by the thermosonic thermocompression bonding method, even if the Au bumps are ruptured by adding a load and vibration from the chip side or the lead side for compression bonding, the Si substrate or the transistor element under the bumps is not damaged, such as by generation of cracks. Accordingly, generation of failed products by the bonding damage can be prevented, and the production yield can be improved.

Figure 23:
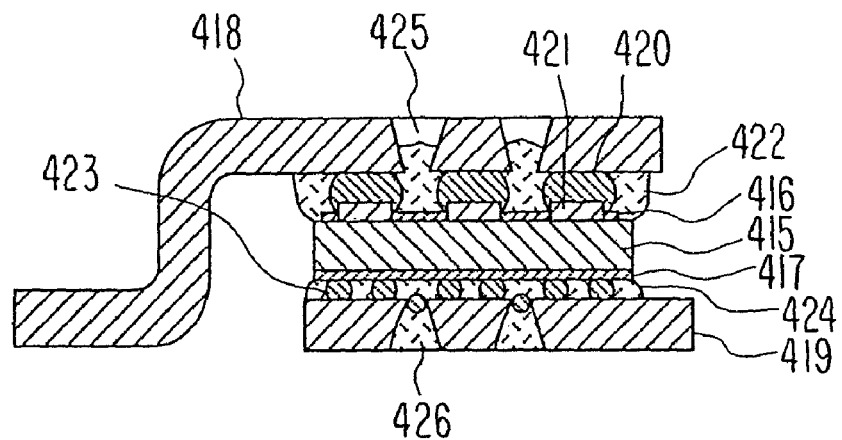
FIG. 23 is a cross-sectional view of another embodiment of the transistor package of the present invention.

FIG. 23 indicates one of the other embodiments of the transistor package relating to the present invention. In accordance with FIG. 23, an Al electrode 416 of 5 µm thick is formed on the circuit forming plane of the transistor chip 415, and the rear plane electrode 417, the outermost surface of which is made of Ag, is formed on the opposite plane. The reference numeral 418 in FIG. 23 indicates a lead. The Au bumps 420 are formed on the Al electrode by a ball bonding method. The reference numeral 423 in FIG. 23 indicates a Ag bump. In this step, all of the Al electrode film under the bumps is changed to a Au—Al alloy layer 421 by heat treatment of, for instance, 300° C.-2 hours, or 250° C.-10 hours. The openings 425, 426 are formed in the chip facing regions of the electrode lead 416 and the die pad mounting lead 419, and all of the surface of the members is plated with Pd/Au flush plating. The electrode lead is bonded with the Au bumps formed on the Al electrode by an incorporated thermosonic thermocompression bonding method at a relatively low temperature lower than 200° C. The first resin 422 is supplied in the form of sheet, and adhered and cured simultaneously with the bonding of the Au bumps. The height of the Au bumps (resin height) is several tens microns. The chip rear plane electrode and the die pad mounting leads hold between them the second resin 424 in the form of a sheet, wherein precious metal particles are buried and the chip rear plane electrode and the die pad mounting lead are bonded by compression with the addition of ultrasonic waves and heating at a relatively low temperature lower than 250° C. The precious metal particles, i.e. the particles made of Ag in this case, are deformed by compression from the rear electrode and the die pad mounting lead with heating, compressing, and ultrasonic vibrating, and a metallic bonded condition results. The first and second resin are adhered to the upper and the lower members, and give a compression stress to the bonding portion due to the shrinking phenomenon at the curing time.

In accordance with the present embodiment, a package of high reliability and low resistance, and which is desirable in view of environment problems can be provided as well as the package indicated in FIG. 22(a). Furthermore, because the electrode and the resin, and the die pad mounting lead and the resin are bonded tightly by mechanical bonding at the openings, in addition to the chemical bonding (adhering) at the boundary plane, peeling off of the resin adhered portions does not occur even under a high temperature and high humidity environment and the temperature cycle environment, the strain added to the metallic bonding portions of the Au bumps and Ag particle can be decreased, and the reliability of the package can be improved significantly.

Figure 24:
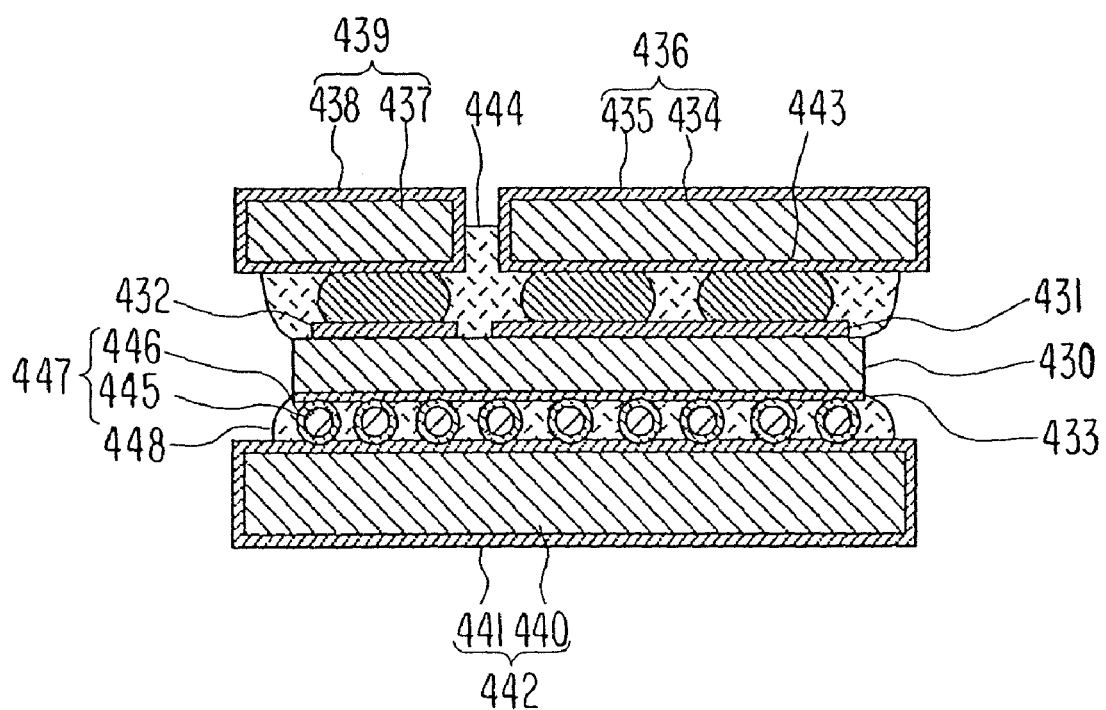
FIG. 24 is a cross-sectional view of another embodiment of the transistor package of the present invention.

FIG. 24 indicates one of the other embodiments of the transistor package relating to the present invention. In accordance with FIG. 24, the Al electrodes 431, 432 of 3.5 µm thick are formed on the circuit forming plane of the transistor chip 430, and the rear plane electrode 433, the outermost surface of which is Ag, is formed on the opposite plane. The reference numerals 434, 437 and 438 in FIG. 24 indicates a Cu core. The Au bumps 433 are formed on the Al electrode by a ball bonding method. All of the surface of the members of the electrode leads 436, 439 and the die pad mounting lead 442 are plated by Pd/Au flush plating 435, 438, 441. The electrode leads and the Au bumps formed on the Al electrode are bonded by the incorporated thermosonic thermocompression bonding method at a relatively low temperature lower than 200° C. The first resin 441 is supplied in a liquid state to fill into gaps after the thermosonic thermocompression bonding, and is adhered and cured. The chip rear plane electrode and the die pad mounting leads hold between them the second resin 448 in the form of a sheet, wherein precious metal particles are buried, and the chip rear plane electrode and the die pad mounting lead 442 are bonded by compression with the addition of ultrasonic waves and heating at a relatively low temperature lower than 250° C. The precious metal particles 447, i.e. the particles made of Cu 445 of 30 μm, the surface of which is plated with Ag 446 to 5 μm thick in this case, are deformed by compression from the rear electrode and the die pad mounting lead with heating, pressing, and ultrasonic vibration, and a metallic bonded condition. The first and second resin are adhered to the upper and the lower members, and give a compression stress to the bonding portion due to the shrinking phenomenon at the curing time. The two electrode leads and the die pad mounting lead are arranged at opposite planes respectively with the chip interposed between them, and the size of each lead is approximately the same as the size of the chip.

In accordance with the present embodiment, a package of high reliability and low resistance, and which is desirable in view of environment problems can be provided as well as the package indicated in FIG. 22. Furthermore, because Ag plated Cu particles having cores made of Cu, which is cheaper than a precious metal, are used for bonding the chip rear plane electrode with the die pad mounting lead, the component cost can be decreased. Further, because the planes of the external connection terminals are arranged at upper and lower sides of the chip, a structure, wherein the mounting can be performed by holding the package from both sides of the chip, can be adopted, and the mounting by mechanical contact can be performed readily. A chip size package can be realized, and high density mounting becomes possible by decreasing the mounting area.

Figure 25:
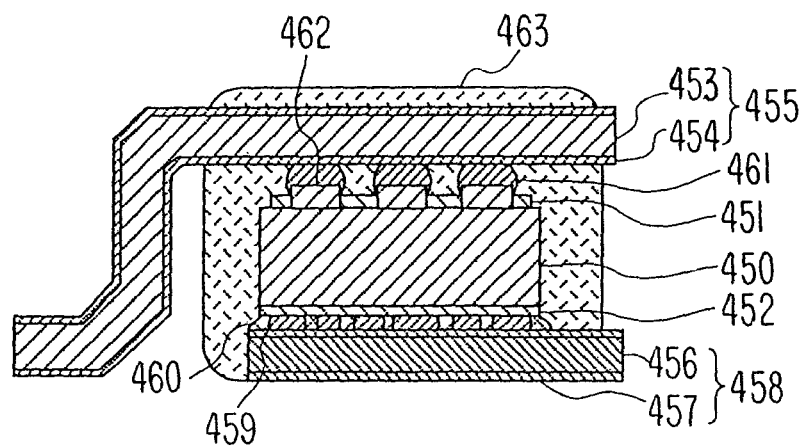
FIG. 25 is a cross-sectional view of another embodiment of the transistor package of the present invention.

FIG. 25 indicates one of the other embodiments of the structure of the transistor package relating to the present invention. In accordance with FIG. 25, an Al electrode 451 of 3.5 μm thick is formed on the circuit forming plane of the transistor chip 450, and the rear plane electrode 452, the outermost surface of which is plated with Au, is formed on the surface of the opposite plane. The reference numerals 453 and 456 in FIG. 25 indicate a Cu core, and the reference numeral 457 indicates a plate with a precious metal. The Au bumps 461 are formed on the Al electrode by a ball bonding method. The reference numeral 463 in FIG. 25 indicates a resin body. In this step, all the Al electrode film under the bumps is changed to a Au—Al alloy layer 462 by heat treatment of, for instance, 300° C.-2 hours, or 250° C.-10 hours. The surface of the electrode lead 455 is plated with Pd/Au 454, and the electrode leads are bonded with the Au bumps formed on the Al electrode by an incorporated thermosonic thermocompression bonding method at a relatively low temperature lower than 200° C. The chip rear plane electrode and the die pad leads hold between them the die pad bonding resin 460 in the form of a sheet, wherein precious metal particles 459 are buried, and the chip rear plane electrode and the die pad lead 458 are bonded by compression with the addition of ultrasonic waves and heating at a relatively low temperature lower than 250° C. The precious metal particles 447, i.e. the particles made of Ag in this case, are deformed by compression to the rear electrode and the die pad mounting lead with heating, pressing, and ultrasonic vibrating, and a metallic bonded condition results. All of the chip and the respective leads are covered with mold resin except the external connection terminals. A compression stress is applied to the bonding portions of the chip and each of the leads by the shrinking phenomenon of the resin at the curing time.

In accordance with the present embodiment, the bonding portion of the Au bumps with the Al electrode film I-S strengthened to twice the normal strength by alloying to the Au—Al alloy, and the $AuAl_2$ compound having a weak strength, which is generally formed by holding the package at a high temperature, is not formed. Therefore, a low resistance transistor package having superior temperature cycle reliability can be realized.

Figure 26:
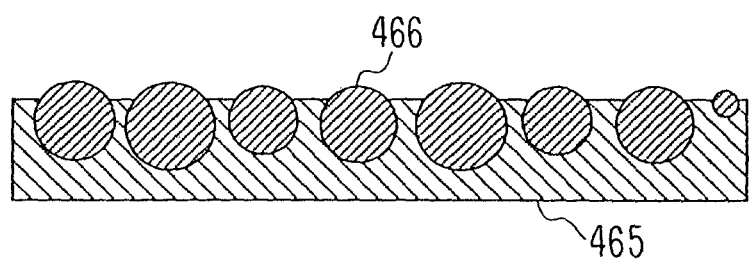
FIG. 26 is a cross-sectional view of an embodiment of a cross sectional structure of the die pad-bonding film of the present invention.

FIG. 26 indicates an embodiment of the die pad-bonding adhering film of the present invention.

In accordance with FIG. 26, the precious metal particles 466 are buried into the resin film 465 under a condition wherein a part of the particle is exposed at the surface of the resin film. The precious metal particle is selected from the group consisting of Ag, Au, Pd, Pt, and particles obtained by plating Cu, Ni cores with Ag, Au, Pd, and Pt, respectively. The sizes of the particles are composed such that a large number of the particles having at least a half of the film thickness are contained therein. The resin film is selected from the group consisting of polyimide resin, epoxy resin, polyester resin, and phenol resin, and the resin is manufactured to a condition wherein thermoplastic and thermosetting properties are concurrently provided (a condition that the solvent is evaporated and the resin is semi-cured).

Figure 27:
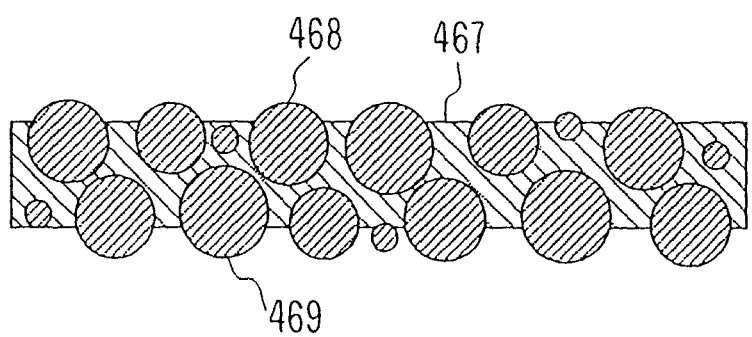
FIG. 27 is a cross-sectional view of another embodiment of a die pad-bonding film of the present invention.

FIG. 27 indicates one of the other embodiments of the die pad-bonding adhering film of the present invention.

In accordance with FIG. 27, the precious metal particles 468, 469 are exposed to both surfaces at the resin film 467.

Figure 28A:
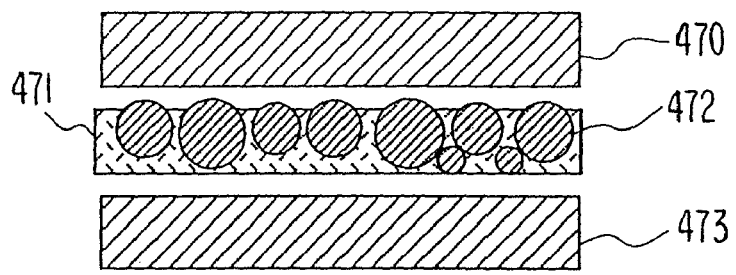
FIGS. 28(a), 28(b) and 28(c) are cross-sectional views representing steps of a bonding method using the die pad-bonding film of the present invention.
Figure 28B:
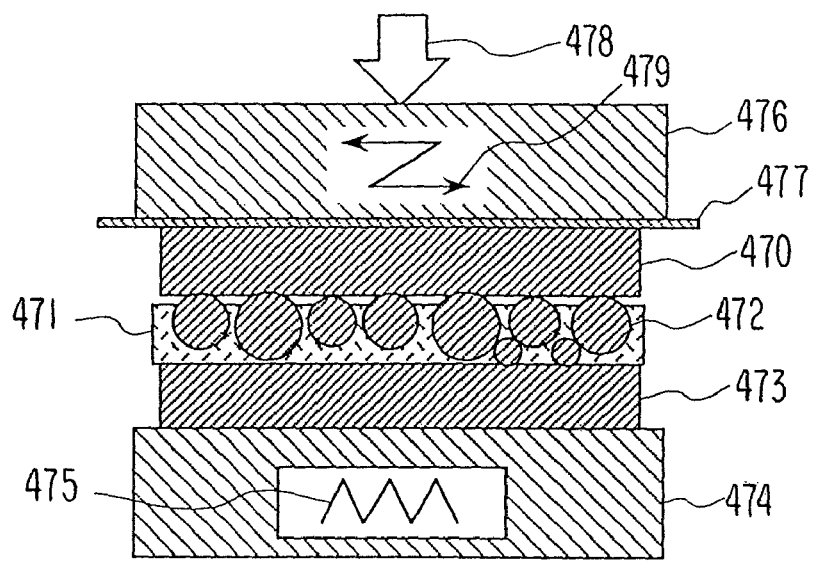
Figure 28C:
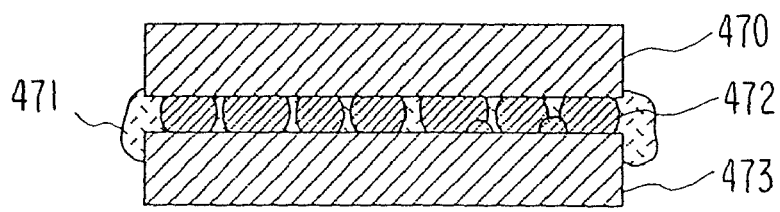

FIGS. 28(*a*) to 28(*c*) are directed to indicates a method for adhering two members using the die pad-bonding film indicated in FIG. 26. In the step shown in FIG. 28(*a*), the chip member 470, whereon a precious metal thin film is deposited, the die pad-bonding film 471, wherein Ag particles 472 are buried, and the die pad mounting lead 473, the bonding plane of which is plated with thick Ag, are laminated and positioned. Then, in the step shown in FIG. 28(*b*), the laminated work is placed on the heating stage 474 and is compressed by applying the load 478 with the bonding tool 476 via the organic film 477. The reference numeral 475 in FIG. 28(*b*) indicates a heater. At the time when the temperature of the work is elevated to a designated temperature, ultrasonic vibration 479 is applied to the bonding tool in order to push in the chip member into the die pad-bonding film while rupturing the Ag particles for metallic bonding of the chip member with the die pad mounting lead via the Ag particles, thereby adhering the chip member and the die pad mounting lead via the die pad-bonding film. The temperature at the start of application of the ultrasonic waves is the temperature at which softening of the die pad-bonding film begins, and the final heating temperature is the temperature at which the die pad-bonding film is cured. The organic film interposed between the bonding tool and the chip member is changed at every operation or per several operations. Accordingly, a method is adopted in which the organic film is supplied in a rolled tape state and is transferred in an orderly manner to the operating portion. The material of the organic film is composed of an organic material having a high glass transition temperature, which does not become soft at the bonding temperature. The condition after bonding is indicated in FIG. 28(*c*). The chip member and the die pad mounting lead are bonded metallically at plural portions via one or two of the Ag particles, and an excess amount of the die pad-bonding film is pushed outside from the gap between the both members. Accordingly, no void is generated in the resin filling the gap.

In accordance with the present embodiment, a clean metallic surface of the Ag particle can be compressed onto the chip member, because the Ag particles are exposed out from the die pad-bonding film; the Ag particle can be deformed certainly, and microscopic plastic flow of both metallic members is generated, because the size of the Ag particle is made larger than the gap; and the ensured metallic bonding becomes possible by adding the ultrasonic vibration. On the other hand, in accordance with the bonding step of the Ag particles with the die pad mounting lead, the Ag particle contacts the die pad mounting lead by pushing away the resin film, which is softened by elevation of the temperature, in the step in which laminated work is placed on the heating stage and the load is applied by the bonding tool via the chip. At this time, the resin is still in a solid state and does not make the surface of the metal wet, and the Ag particle and the die pad mounting lead can contact each other with a clean metallic boundary. Therefore, ensured metallic bonding becomes possible by adding the ultrasonic vibration. The resin first reaches a liquid state by heating after tight contact of the Ag particles and the die pad mounting lead. After the excess amount of the resin is pushed outside through the gap between the chip and the die pad mounting lead, its curing starts. In accordance with the phenomenon described above, the two members are certainly bonded metallically via the Ag particles, and, simultaneously, the adhering with the resin proceeds concurrently. Therefore, the number of the bonding steps can be decreased, and improvement of the productivity can be realized.

The reference numeral 481 in FIG. 29 indicates a Si substrate, the reference numeral 482 indicates an Al film, the reference numeral 483 indicates a Au bump, and the reference numeral 484 indicates a AuAl alloy. The reference numeral 485 in FIG. 30 indicates a Si substrate, the reference numeral 488 indicates a AuAl alloy, and the reference numeral 489 indicates an electrode lead.

Because the organic film is inserted between the bonding tool and the chip member as a consumable article, damage to the chip member by contact with the hard bonding tool can be prevented, and the production yield of the package can be increased. Furthermore, consumption of the bonding tool can be prevented, and the usable cycles of the apparatus can be increased significantly. Accordingly, a decrease of the production cost can be realized.

As described above in detail, in accordance with the present invention, the semiconductor package, wherein the strength of the bonding portions of Al the electrode/Au bumps/electrode lead is increased, can be provided.

Figure 31:
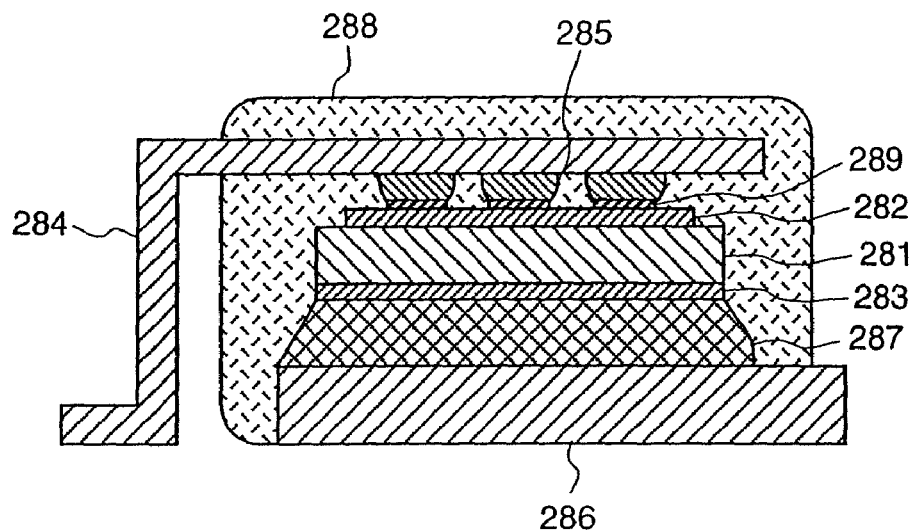
FIG. 31 is a cross-sectional view of an embodiment in which the bump of the front plane side electrode is alloyed with a metal having a low melting point.

FIG. 31 indicates an embodiment of the present invention in a case when the bump containing precious metal at the front plane side electrode is made of an alloy with low melting point metals.

In accordance with FIG. 31, the metallized film 289 of Ti/Ni/Au, Ti/Ni/Ag, Cr/Cu/Ni/Au, or Cr/Cu/Ni/Ag, in a specified pattern is formed on the front plane side Al electrode pad 282 of the vertical semiconductor element 281, and the metallized electrode 283, the outermost surface of which is Ag or Au, is formed on the rear side plane. The die pad 286 is connected metallically all over the surface of the metallized electrode 283 by the solder 287 containing Ag—Sn as a basic composition, for instance, Ag—Sn—Pb, Ag—Sn—Pb—Cu, and the like. The lead 284 is connected metallically with the front plane side metallized film 289 by the alloy bumps 285 containing Ag—Sn as a basic composition. The connecting portion is formed only in a specified region, wherein the metallized film 289 of the front plane side electrode is formed. The semiconductor element, the lead, and a part of the die pad is protected by covering them with resin 288. The lower plane of the die pad is exposed to the surface of the resin body and is reshaped in a condition that the die pad protrudes out horizontally from the plane of the resin body opposite to the lead. The lead protrudes from the middle portion of the side plane of the resin body and is folded so that the lower plane of the lead is reshaped to be approximately at the same level as the lower plane of the die pad. Here, approximately the same includes a range in which the difference in height is within the thickness of the lead or the die pad.

Figure 32:
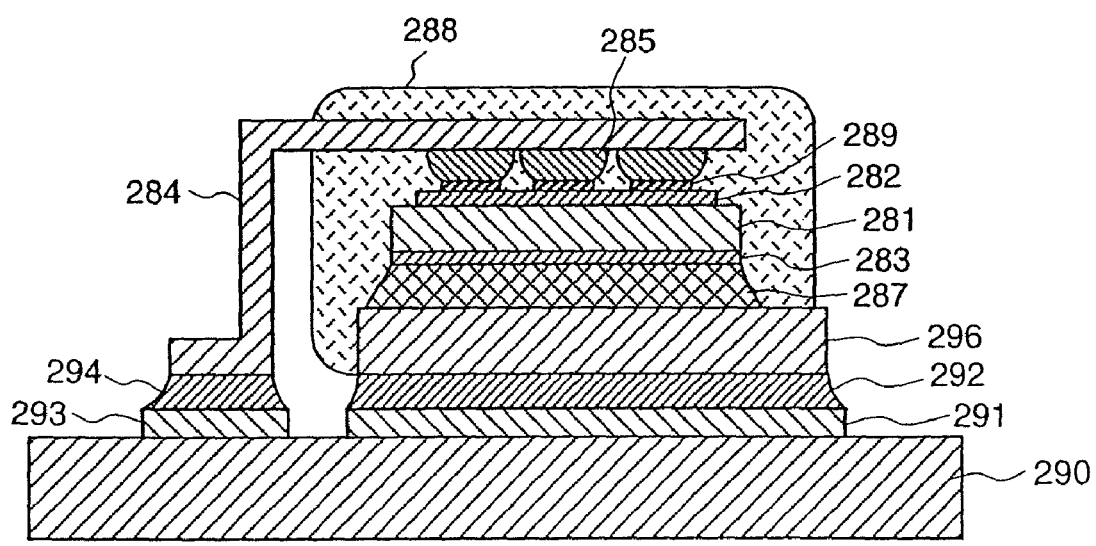
FIG. 32 is a cross-sectional view of an embodiment in which the semiconductor package shown in FIG. 31 is mounted onto the wiring substrate.

FIG. 32 indicates an embodiment of the present invention for a case in which the semiconductor package indicated in FIG. 31 is mounted on a wiring substrate.

In accordance with FIG. 32, a Ni/Au film is formed on the surface of the connecting terminals 291, 293 formed on the wiring substrate 290, and the lead 284 of the package is connected to the lower plane of the die pad 286 with a low melting point metal, which is able to form a connection at an operating temperature lower than the melting point of the connecting alloy 285, 287 in the package. The reference numeral 296 in FIG. 32 indicates a die pad. When the connecting alloy in the package is selected from the Ag—Sn—Cu group, the wiring substrate connecting alloy is a solder of the Sn—Bi group or Sn—In group. When the connecting alloy in the package is selected from the Ag—Sn—Pb group, a solder of the Sn—Ag group is used as the wiring substrate connecting alloy.

In accordance with the present embodiment, the chip electrode and the lead are connected by the bumps. Accordingly, because the connection distance is short and the connecting area, that is, the conducting area, is wide, the electrical resistance at the connecting portion can be decreased. By forming the bumps with an alloy composed of a precious metal added with low melting point metals, the amount of the precious metal being used can be decreased, and the surface of the leads can be composed with the low melting point metals. Accordingly, the cost for the members can be decreased. On the contrary, when the surface electrode is connected with a fused alloy, a short circuit between the adjacent two electrodes becomes a problem. However, in accordance with the present embodiment, the metalized film, which is wettable with the connecting alloy formed on the chip side electrode, is restricted to form in a specified region. Accordingly, even if the distance between the electrodes is short, a short circuit can be prevented, because the fused metal is not spread widely, nor comes too close. In accordance with the present embodiment, the chip electrode is connected to the upper and lower metallic members with the fused metal, and no external force is added to the chip electrode during the connection operation. Therefore, the assembling yield can be increased by preventing damage to the chip, and the cost for production can be decreased. Because the pad protrudes from the side plane of the resin body horizontally, the soldering portion for mounting onto the wiring substrate is visible, so that soldering failure can be inspected readily and generation of a defective product can be prevented.

In accordance with the present embodiment, the low melting point alloy containing a precious metal is used as the material for the bumps, but a low melting point alloy containing no precious metal has the same advantages as the present embodiment.

Figure 33:
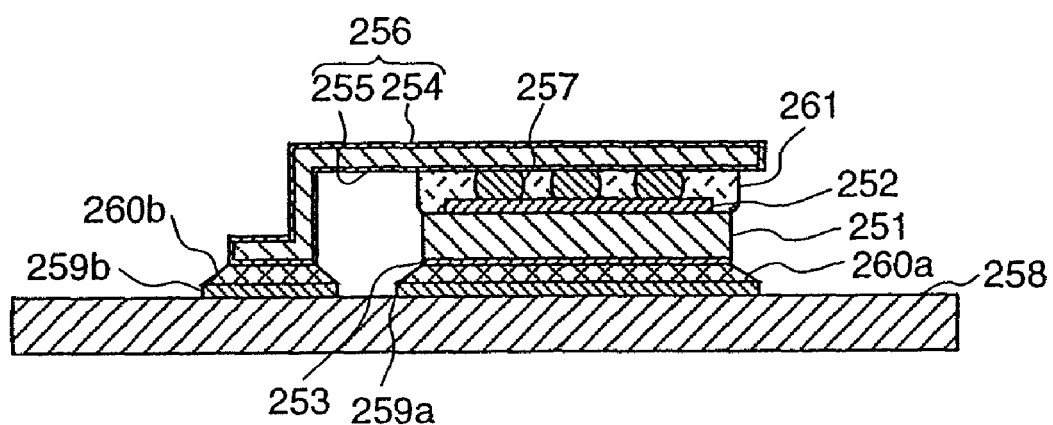
FIG. 33 is a cross-sectional view of an embodiment in which the semiconductor package of the present invention is mounted while omitting the die pad onto the wiring substrate.

FIG. 33 indicates an embodiment of the present invention for a case in which, the semiconductor package of the present invention, die pad of which is omitted, is mounted on the wiring substrate.

The reference mark 255 indicates a Cu core, the reference numeral 259*b* indicates a connection pad (a and b are same), and the reference numerals 260*a* and 260*b* indicate a solder.

In accordance with FIG. 33, the Au bumps 257 are formed on the front plane side Al electrode pad 252 of the vertical type semiconductor chip 251, the bumps are connected metallically to the lead 256 plated with precious metal, and the periphery of the bumps is reinforced by the resin 261. The metalized electrode 253 at the rear plane of the chip is connected directly to the connection pad 259 of the wiring substrate 258 with the solder 260. The external connecting plane of the lead is connected to the connecting terminals with the same kind of solder. The metalized electrode plane at the rear plane of the chip and the external connecting plane of the lead are formed so that their height become approximately to the same level, in other words, the difference of the height is within the thickness of the lead. In accordance with FIG. 33, the lead and the chip are exposed outside in the condition mounted onto the substrate. However, if the environment is not desirable, the lead and the chip may be covered with a second resin by potting.

In accordance with the present embodiment, the die pad is not used, and the package structure becomes simple. Therefore, the cost for assembling and the cost for the components can be decreased, and the production cost can be decreased significantly. Because the electrode at the rear plane of the chip is connected directly to the connecting terminals of the wiring substrate by soldering, the electrical resistance between them can be decreased, and the on-resistance of the package can be decreased. The height of the package can be decreased to the extent that the die pad omitted, and so an ultra thin substrate mounting can be realized. If the package is sealed with a potting resin after mounting, the temperature cycle reliability at the connecting portion at the rear plane of the chip is improved in comparison with the conventional structure using the die pad, and an electronic apparatus having a high reliability can be realized.

Figure 34:
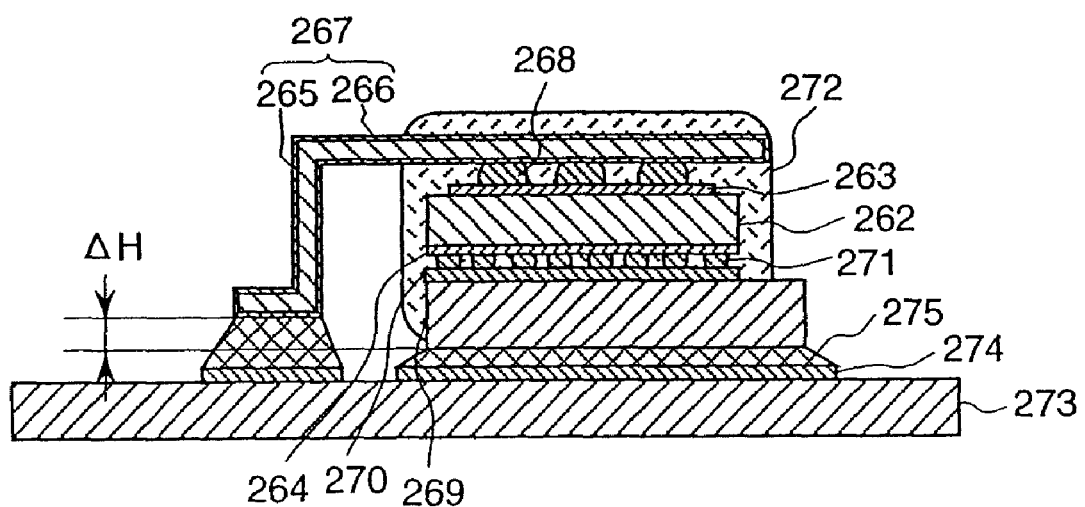
FIG. 34 is a cross-sectional view of an embodiment in which a plane mounting type semiconductor package of the present invention is mounted onto the wiring substrate.

FIG. 34 indicates an embodiment of the present invention for a case in which the plane mounting type semiconductor package of the present invention is mounted on a wiring substrate.

The reference numeral 263 in FIG. 34 indicates an Al electrode pad, the reference numeral 264 indicates a metalized electrode, the reference mark 265 indicates a Cu core, the reference numerals 266 and 270 indicate a plate with precious metal, the reference numeral 273 indicates a wiring substrate, and the reference numeral 274 indicates a connection pad.

In accordance with FIG. 34, the Au bumps 268 are formed on the Al electrode pad of the vertical type semiconductor chip 262, the bumps are connected metallically to the lead 267, the surface of which is plated with a precious metal. A metalized layer, the outermost surface of which is a precious metal, is formed at the rear plane of the chip, and the metalized layer is connected electrically to the die pad 269 plated with a precious metal with precious metal particles 271. The chip, the lead, and a part of the die pad are covered with the resin 272 for protection and reinforcement. The lower plane of the die pad is exposed to the bottom surface of the resin body and protrudes to the side plane. On the other hand, the lead protrudes from the middle portion of the opposite side plane of the resin body and is manufactured to be folded so that the height of the external connecting portion becomes approximately the same as the height of the external connecting portion of the die pad. The plane mounting is performed by connecting to the connecting terminals of the wiring substrate by soldering. Because the connecting terminals are aligned approximately at a definite height in the range of several tens of microns, the external connecting terminals of the package must be aligned with their height. In accordance with the present embodiment, a small variation in height can be absorbed by the difference of the thickness of the solder 275, and the allowable difference of the height (ΔH) is the same as the difference in the thickness of the lead (smaller than approximately several hundreds micron). The plane mounting package may be any package, if the difference of the external connecting plane facing the wiring substrate of which is controlled to within the thickness of the lead or the die pad.

In accordance with the present embodiment, a structure, wherein the die pad protrudes from the side plane of the resin body, is adopted. Accordingly, the solder connecting portion can be confirmed visually from the top side when the package is mounted onto the wiring substrate, whereby the connecting portions can be inspected readily, and production velocity is increased. Furthermore, the cost for assembling can be decreased, and the operability is improved.

Figure 35A:
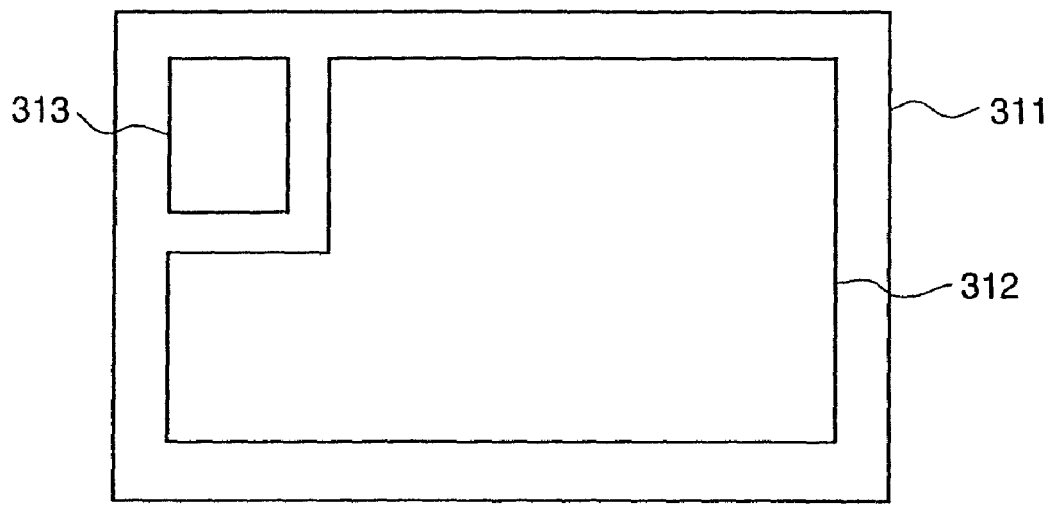
FIG. 35(a) is a top plan view and FIG. 35(b) is a cross-sectional view of a semiconductor element used in the assembling of the semiconductor package of the present invention.
Figure 35B:
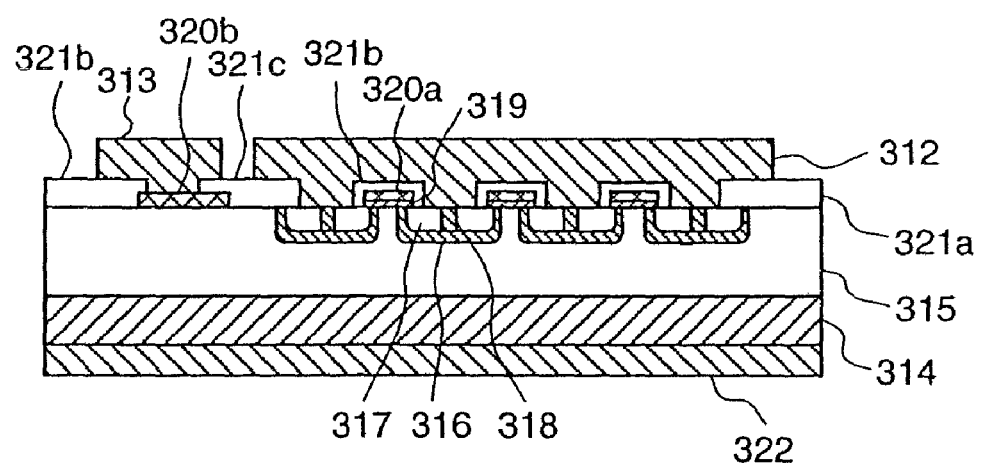

FIG. 35(a) indicates a plan view of the vertical semiconductor element used in assembling the semiconductor package by the present invention, and FIG. 35(b) shows an example of its cross sectional structure. The reference numeral 311 in FIG. 35(a) indicates a transistor chip, the reference numeral 312 indicates a source electrode, and the reference mark 313 indicates a gate electrode pad.

In accordance with FIG. 35(b), n-type epitaxial layer 315 is formed on the high concentration n-type substrate 314, and p-type and n-type patterns are formed in the layer in a condition wherein the depths and shapes are controlled. The gate oxide film 316 is formed at a position, which includes the p-type diffusion layer 316 formed so as to surround the contact area of the source electrode, and n-type layers 317, 318, at right and left. The gate electrode line 320 is formed on the oxide film. The gate electrode line is coated with the insulating layer 321 so as not to contact the source electrode pad 312 and is connected to the gate electrode pad 313. The reference numeral 319 in FIG. 35(b) indicates a metal oxide, the reference numerals 320a and 320b indicate a gate electrode line, the reference numerals 321a, 321b and 321c indicate an insulating layer, and the reference number 322 indicates a metalized drain electrode. Generally, aluminum is used as the material of the gate and source electrode pad, but in some cases, another metal is metalized thereon. Generally, the plane whereon the pattern of the diffusion layer is formed is called the front plane, and the opposite plane is called the rear plane. The present element is a so-called MOSFET, which controls the current passing through the source/drain in accordance with the presence of, or magnitude of, the voltage applied to the gate electrode. A decrease of the on-resistance of the present element is remarkably advantageous in view of the reduced power loss. An effect to decrease the resistance is achieved by controlling the profile of the npn structure in the epitaxial layer and the impurity concentration, but the most effective method is to shorten the conducting distance by decreasing the thickness of the wafer. Therefore, pn elements, circuit patterns, and electrode pads are formed on the surface of the Si wafer, the thickness of which makes it possible to handle the wafer in the manufacturing steps. Subsequently, the rear plane of the wafer is ground to make the high density n-type substrate 314 thin, and finally, the drain electrode metalized layer at the rear plane is formed to produce the element.

In a case when the rear plane ground element of the present embodiment is used, the contacting area with the metalized layer is increased, because the grinding mark at the rear plane forms adequate bumps and dips, and the bumps and dips perform further a role of an anchor effect. Therefore, because the ohmic contact resistance of the rear plane electrode is decreased, and adherence of the rear plane electrode with the metalized layer is increased, improved effects in both electrical characteristics and reliability can be realized.

The present invention is applicable to not only a MOSFET, but to any element, the resistance or impedance of which must be decreased, such as diodes, thyristors, photo-elements, and the like.

The invention claimed is:

1. A semiconductor device comprising:
a semiconductor chip including a MOSFET having an obverse surface and a reverse surface opposite to the obverse surface;
a first electrode of the MOSFET formed on the obverse surface,
a second electrode of the MOSFET formed on the obverse surface, and
a third electrode of the MOSFET formed on the reverse surface,
a first conductive member having a first top surface and a first bottom surface opposite to the first top surface and connecting with the first electrode of the semiconductor chip electrically;
a second conductive member having a second top surface and a second bottom surface opposite to the second top surface and connecting with the second electrode of the semiconductor chip electrically;
a third conductive member having a third top surface and a third bottom surface opposite to the third top surface and connecting with the third electrode of the semiconductor chip electrically; and
a sealing body having a top surface and a bottom surface opposite to the top surface and sealing the semiconductor chip, and parts of the first, second, and third conductive members;
wherein the first conductive member has a first portion, a second portion, and a third portion,
the first portion of the first conductive member is positioned over the first electrode of the semiconductor chip, the first bottom surface of the first portion of the first conductive member is electrically connected with the first electrode of the semiconductor chip,
the second portion is positioned between the first and third portions, and
the third portion is positioned under the obverse surface of the semiconductor chip and next to a first side of the semiconductor chip in plan view,
wherein the third conductive member is positioned under the third electrode of the semiconductor chip, the third top surface of the third conductive member is electrically connected with the third electrode of the semiconductor chip,
wherein a part of the first top surface of the first portion of the first conductive member is exposed from the top surface of the sealing body,
wherein a part of the third bottom surface of the third conductive member is exposed from the bottom surface of the sealing body,
wherein the first portion of the first conductive member overlaps the first side of the semiconductor chip in plan view, and
wherein a height of the first bottom surface of the third portion of the first conductive member and a height of the third bottom surface of the third conductive member are same.

2. The semiconductor device according to claim 1, wherein the second conductive member overlaps the first side of the semiconductor chip in plan view.

3. The semiconductor device according to claim 1, wherein the first, second, and third electrodes are source, gate, and drain electrodes, respectively.

4. A semiconductor device comprising:
a semiconductor chip including a MOSFET having an obverse surface and a reverse surface opposite to the obverse surface;
a source electrode of the MOSFET formed on the obverse surface,
a gate electrode of the MOSFET formed on the obverse surface, and
a drain electrode of the MOSFET formed on the reverse surface,
a first conductive member having a first top surface and a first bottom surface opposite to the first top surface and connecting with the source electrode of the semiconductor chip electrically;
a second conductive member having a second top surface and a second bottom surface opposite to the second top surface and connecting with the gate electrode of the semiconductor chip electrically;
a third conductive member having a third top surface and a third bottom surface opposite to the third top surface and connecting with the drain electrode of the semiconductor chip electrically; and
a sealing body having a top surface and a bottom surface opposite to the top surface and sealing the semiconductor chip, and parts of the first, second, and third conductive members;
wherein the first conductive member has a first portion, a second portion, and a third portion,
the first portion of the first conductive member is positioned over the source electrode of the semiconductor chip, the first bottom surface of the first portion of the first conductive member is electrically connected with the source electrode of the semiconductor chip,
the second portion is positioned between the first and third portions, and
the third portion is positioned under the obverse surface of the semiconductor chip and next to a first side of the semiconductor chip in plan view,
wherein the third conductive member is positioned under the drain electrode of the semiconductor chip, the third top surface of the third conductive member is electrically connected with the drain electrode of the semiconductor chip,
wherein a part of the first top surface of the first portion of the first conductive member is exposed from the top surface of the sealing body,
wherein a part of the third bottom surface of the third conductive member is exposed from the bottom surface of the sealing body,
wherein the first portion of the first conductive member overlaps the first side of the semiconductor chip in plan view, and
wherein a height of the first bottom surface of the third portion of the first conductive member and a height of the third bottom surface of the third conductive member are same.

* * * * *